(12) United States Patent
Hill et al.

(10) Patent No.: US 11,778,915 B2
(45) Date of Patent: *Oct. 3, 2023

(54) SUBSTITUTED ALUMINUM NITRIDE FOR IMPROVED ACOUSTIC WAVE FILTERS

(71) Applicant: SKYWORKS SOLUTIONS, INC., Irvine, CA (US)

(72) Inventors: Michael David Hill, Emmitsburg, MD (US); Peter Ledel Gammel, Lynnfield, MA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 139 days.

This patent is subject to a terminal disclaimer.

(21) Appl. No.: 17/308,168

(22) Filed: May 5, 2021

(65) Prior Publication Data

US 2021/0280771 A1    Sep. 9, 2021

Related U.S. Application Data

(63) Continuation of application No. 16/026,436, filed on Jul. 3, 2018, now Pat. No. 11,031,540.
(Continued)

(51) Int. Cl.
| | |
|---|---|
| *C01B 21/072* | (2006.01) |
| *H01L 41/187* | (2006.01) |
| *H10N 30/853* | (2023.01) |
| *H03H 9/02* | (2006.01) |
| *H03H 9/54* | (2006.01) |
| *H03H 9/205* | (2006.01) |
| *H03H 3/02* | (2006.01) |

(52) U.S. Cl.
CPC ......... *H10N 30/853* (2023.02); *C01B 21/072* (2013.01); *H03H 9/02031* (2013.01); *H03H 9/54* (2013.01); *C01P 2002/52* (2013.01); *C01P 2002/54* (2013.01); *C01P 2002/76* (2013.01); *C01P 2002/77* (2013.01); *C01P 2006/40* (2013.01); *H03H 3/02* (2013.01); *H03H 9/205* (2013.01)

(58) Field of Classification Search
CPC ........ C01B 21/072; H01L 41/187; H03H 9/00
See application file for complete search history.

(56) References Cited

U.S. PATENT DOCUMENTS

| | | |
|---|---|---|
| 4,952,535 A | 8/1990 | Merkel |
| 5,637,541 A | 6/1997 | Kuszyk et al. |
| | (Continued) | |

FOREIGN PATENT DOCUMENTS

| | | |
|---|---|---|
| CN | 1541447 A | 10/2004 |
| EP | 2246458 A1 | 11/2010 |
| | (Continued) | |

OTHER PUBLICATIONS

Luo et al., "Influence of Cr-doping on microstructure and piezoelectric response of AlN films", Journal of Physics D: Applied Physics, vol. 42, 235406 (2009), 6 pages.
(Continued)

*Primary Examiner* — Matthew E. Hoban
(74) *Attorney, Agent, or Firm* — Lando & Anastasi, LLP

(57) ABSTRACT

An acoustic wave resonator comprises a piezoelectric material formed of aluminum nitride (AlN) doped with calcium (Ca) to enhance performance of the acoustic wave resonator.

22 Claims, 28 Drawing Sheets

Related U.S. Application Data

(60) Provisional application No. 62/529,742, filed on Jul. 7, 2017.

(56) References Cited

U.S. PATENT DOCUMENTS

| | | | |
|---|---|---|---|
| 7,682,709 | B1 | 3/2010 | Davis et al. |
| 7,758,979 | B2 | 7/2010 | Akiyama et al. |
| 8,841,819 | B2 | 9/2014 | Nishihara et al. |
| 9,071,225 | B2 | 6/2015 | Nishihara et al. |
| 9,088,265 | B2 | 7/2015 | Bradley et al. |
| 9,136,819 | B2 | 9/2015 | Grannen et al. |
| 9,154,111 | B2 | 10/2015 | Bradley et al. |
| 9,225,313 | B2 | 12/2015 | Bradley et al. |
| 9,246,461 | B2 | 1/2016 | Akiyama et al. |
| 9,455,681 | B2 | 9/2016 | Feng et al. |
| 9,520,855 | B2 | 12/2016 | Feng et al. |
| 9,577,603 | B2 | 2/2017 | Burak et al. |
| 9,590,165 | B2 | 3/2017 | Zou et al. |
| 9,602,073 | B2 | 3/2017 | Grannen et al. |
| 11,031,540 | B2 | 6/2021 | Hill et al. |
| 2003/0178633 | A1 | 9/2003 | Flynn et al. |
| 2004/0189423 | A1 | 9/2004 | Loebl et al. |
| 2006/0183625 | A1 | 8/2006 | Miyahara |
| 2007/0284971 | A1 | 12/2007 | Sano et al. |
| 2008/0075976 | A1 | 3/2008 | Yamamoto et al. |
| 2013/0049544 | A1* | 2/2013 | Yokoyama ............ H01L 41/187 310/365 |
| 2013/0241673 | A1 | 9/2013 | Yokoyama et al. |
| 2014/0125203 | A1* | 5/2014 | Choy ................. H03H 9/173 310/365 |
| 2014/0125432 | A1 | 5/2014 | Stephanou et al. |
| 2014/0167560 | A1* | 6/2014 | Onda ................. H03H 9/175 310/311 |
| 2014/0292150 | A1 | 10/2014 | Zou et al. |
| 2015/0326200 | A1 | 11/2015 | Grannen et al. |
| 2015/0333248 | A1 | 11/2015 | Moulard |
| 2015/0357987 | A1 | 12/2015 | Shealy |
| 2017/0077386 | A1 | 3/2017 | Shealy |
| 2017/0294894 | A1* | 10/2017 | Aida ................. H03H 9/02448 |
| 2018/0342999 | A1 | 11/2018 | Gibb et al. |
| 2019/0013458 | A1 | 1/2019 | Hill et al. |
| 2019/0158057 | A1* | 5/2019 | Jeong ................. H03H 9/13 |
| 2019/0238996 | A1 | 8/2019 | Umeda et al. |
| 2021/0273625 | A1 | 9/2021 | Hill |
| 2022/0286108 | A1 | 9/2022 | Hill |

FOREIGN PATENT DOCUMENTS

| | | |
|---|---|---|
| EP | 3153603 A1 | 4/2017 |
| EP | 3633082 A1 | 4/2020 |
| GB | 2277405 A | 10/1994 |
| JP | H01298071 A | 12/1989 |
| JP | H07508966 A | 10/1995 |
| JP | 2017045749 A | 3/2017 |
| JP | 2020526471 A | 8/2020 |
| KR | 10-2018-0102971 A | 9/2018 |
| WO | 2004005216 A1 | 1/2004 |
| WO | 20130141484 A1 | 9/2013 |
| WO | 2016111280 A1 | 7/2016 |
| WO | 2017094520 A1 | 6/2017 |
| WO | 2019235080 A1 | 12/2019 |

OTHER PUBLICATIONS

Office Action and Search Report from corresponding United Kingdom Application No. 2118603.6 dated Mar. 1, 2022.
Tasnadi et al., "Significant configurational dependence of the electromechanical coupling constant of B0.125 A10.875N", Applied Physics Letters, vol. 94, 151911 (2009).
Office Action from corresponding United Kingdom Application No. 2000500.5 dated Jul. 14, 2022.
Office Action from corresponding United Kingdom Application No. 2118603.6 dated Jul. 14, 2022.
Written Opinion from corresponding Singaporean Application No. 11202000131V dated Mar. 19, 2021.
Written Opinion from corresponding Singaporean Application No. 11202000131V dated Jul. 5, 2022.
Office Action from corresponding United Kingdom Application No. 2000500.5 dated Sep. 1, 2022.
Office Action from corresponding United Kingdom Application No. 2210849.2 dated Aug. 25, 2022.
Office Action from corresponding United Kingdom Application No. 2210851.8 dated Aug. 25, 2022.
Office Action from corresponding United Kingdom Application No. 2210857.5 dated Aug. 25, 2022.
10-2018-0102971, KR.
Iborra et al., "Piezoelectric and Electroacoustic Properties of V-Doped and Ta-Doped Al N Thin Films", 2013 Joint U FFC, EFTF and PFM Symposium (Year: 2013).
Felmetsger et al., "Reactive Magnetron Sputtering of Piezoelectric Cr-Doped AlN Thin Films", Ultrasonics Symposium (IUS), 2011 IEEE International, Oct. 18-21, 2011.
Iborra et al., "Piezoelectric and Electroacoustic Properties of V-Doped and Ta-Doped Al N Thin Films", 2013 Joint U FFC, EFTF and PFM Symposium (Year: 2013).
International Search Report and Written Opinion from corresponding International Application No. PCT/US2018/040706 dated Nov. 13, 2018.
Kabulski et al., "Erbium Alloyed Aluminum Nitride Films for Piezoelectric Applications", Materials Research Society, vol. 1129, Jan. 2008, 1129-V09-02 (published online Feb. 1, 2011).
Kano et al., "Enhancement of Piezoelectric Response in Scandium Aluminum Nitride Alloy Thin Films prepared by Dual Reactive Co-Sputtering", Advanced Materials, vol. 17, 2012, pp. 202-207.

* cited by examiner

| Material | Elastic Modulus $c_{33}$ (GPa) | Acoustic Velocity (m/s) | Piezoelectric Coefficient $e_{33}$ (Cm$^{-2}$) | $f \times Q$* (Hz) | $k_{eff}^2$ (%) |
|---|---|---|---|---|---|
| Si | 165 | 8415 | N/A | $2.5 \times 10^{13}$ | N/A |
| SiC | 605 | 13100 | +0.2 | $3.5 \times 10^{14}$ | 0.08 |
| GaAs | 118 | 2470 | −0.16 | --† | 0.04 |
| AlN | 390 | 11000 | +1.55 | $10^{13}$ | 5.6 |
| Sc doped AlN | 244 | 8509 | +3.9 | $3 \times 10^{11}$ | 15.5 |
| LiNbO$_3$ (X-cut,)‡ | 60 | 3900 | +3.65 | $7.7 \times 10^{11}$ (measured) | 16 |
| GaN | 398 | 8044 | +0.65 | $2.5 \times 10^{13}$ (theory) $5 \times 10^{12}$ (measured) | 2 |

\* For anharmonic phonon scattering in Akhieser regime
† Data not available
‡ LiNbO$_3$ data are for shear mode, not longitudinal mode

FIG.3

Calculated spontaneous polarization (in units of $C/m^2$), Born effective charges (in units of $e$), and piezoelectric constants (in units of $C/m^2$) for III–V wurtzite nitrides and II–VI wurtzite oxides. Theoretical results for ZnO and BeO are included.

|  | $P^{eq}$ | $Z^*$ | $du/d\varepsilon_3$ | $e_{33}$ | $e_{31}$ | $e^{(0)}_{33}$ | $e^{(0)}_{31}$ |
|---|---|---|---|---|---|---|---|
| AlN | −0.081 | −2.70 | −0.18 | 1.46 | −0.60 | −0.47 | 0.36 |
| GaN | −0.029 | −2.72 | −0.16 | 0.73 | −0.49 | −0.84 | 0.45 |
| InN | −0.032 | −3.02 | −0.20 | 0.97 | −0.57 | −0.88 | 0.45 |
| ZnO | −0.057 | −2.11 | −0.21 | 0.89 | −0.51 | −0.66 | 0.38 |
| BeO | −0.045 | −1.85 | −0.06 | 0.02 | −0.02 | −0.60 | 0.35 |
| ZnO$^a$ | −0.05 | −2.05 | −0.25 | 1.21 | −0.51 | −0.58 | 0.37 |
| BeO$^a$ | −0.05 | −1.72 | −0.09 | 0.50 | — | −0.29 | — |

FIG.5A

| Property | AlN | GaN | InN |
|---|---|---|---|
| Density (g/cc) | 3.23 | 6.15 | 6.81 |
| Transverse Sound Velocity (cm/s) | $3.70 \times 10^5$ | $2.68 \times 10^5$ | $2.55 \times 10^5$ |
| Longitudinal Sound Velocity (cm/s) | $9.06 \times 10^5$ | $6.56 \times 10^5$ | $6.24 \times 10^5$ |
| Static Dielectric Constant | 8.5 | 8.9 | 15.3 |
| High Frequency Dielectric Constant | 4.77 | 5.35 | 8.4 |
| Energy Gap (eV) | 6.2 | 3.39 | 1.89 |
| Piezoelectiric Coefficient ($e_{14}$) | 0.92 | 0.375 | 0.375 |
| Piezoelectiric Coefficient ($e_{33}$) | 1.55 | | |
| Lattice Parameter a (angstroms) | 3.11 | 3.189 | 3.54 |
| Lattice Parameter c (angstroms) | 4.98 | 5.185 | 5.70 |
| c/a ratio | 1.60 | 1.626 | 1.61 |

FIG.5B

| Material | $\rho$ (g/cc) | $v_s^d = (c_{33}^D/\rho)^{1/2}$ (m/s) | $c_{33}^D$ (GPa) | $c_{33}^E$ (GPa) | $e_{33}$ (c/m$^2$) | $d_{33}$ (pm/V) | $\varepsilon'$ (50 kHz) | $d_{33f} = e_{33}/c_{33}^E$ (pm/V) | $k_t(\%) = [e_{33}^2/(c_{33}^D \varepsilon_{33}^s)]^{1/2}$ | Q | FOM ($k_t^2 \times Q$) |
|---|---|---|---|---|---|---|---|---|---|---|---|
| AlN | 3.260 | 11350 | 420 | 395 | 1.55 | 5.5 | 10.2 | 3.9 | 6.0 | 4000 | |
| ab initio Al$_{.88}$Sc$_{.12}$N | | | | 290 | 1.61 | | 12.0 | | | | |
| experiment Al$_{.88}$Sc$_{.12}$N | 3.255 | 10300 | 345 | 320 | 1.70 | | 13.0 | 5.3 | 7.9 7.3 (BVD circuit) | >650 | |

FIG.8C

| Material | $f_{S,m}$ (GHz) | $Q_{p,m}$ | $Q_{B,m}$ | $k^2_{eff,m}$ (%) | FOM $k^2_{eff,m} \times Q_{B,m}$ | $\varepsilon_r$ | $c^E_{33}$ (GPa) | $e_{33}$ (C/m$^2$) | $k_t^2$ |
|---|---|---|---|---|---|---|---|---|---|
| AlN | 2.3605 | 739 | 790 | 5.50 | 40 | 10.1 | 370 | 1.48 | 6.16 |
| Al$_{0.97}$Sc$_{0.03}$N | 2.2935 | 601 | 730 | 6.89 | 50 | 10.9 | 346 | 1.66 | 7.55 |
| Al$_{0.91}$Sc$_{0.09}$N | 2.2339 | 513 | 690 | 9.50 | 65 | 12.4 | 326 | 1.94 | 9.53 |
| Al$_{0.85}$Sc$_{0.15}$N | 2.1522 | 348 | 410 | 12.07 | 60 | 14.1 | 270 | 2.14 | 12.00 |

FIG. 8D

| Material | $\varepsilon_r$ | $d_{33}$ (pC/N) | $c_{33}$ (GPa) | Longitudinal Sound Velocity (m/sec) | $Q_r$ | $Q_a$ | $k^2$ (%) | FOM |
|---|---|---|---|---|---|---|---|---|
| AlN | 10.0 | 7.0 | 395 | 10900 | 1053 | 1218 | 7.1 | 81 |
| $(Mg_{.5}Zr_{.5})_{0.13}Al_{0.87}N$ | 13.6 | 10.4 | 315 | 9484 | 808 | 651 | 8.5 | 62 |
| $(Mg_{.5}Hf_{.5})_{0.13}Al_{0.87}N$ | 13.3 | 10.5 | 336 | 9214 | 781 | 539 | 10.0 | 65 |

FIG.10C

| Dopant | k² | d₃₃ or e₃₃ | ε' | Elastic Constant | sound Velocity | Q | Temp Stability | Band Gap | c-axis preferred orientation | c/a |
|---|---|---|---|---|---|---|---|---|---|---|
| Ga (In) | reduce | reduce | mildly increase | decrease | decrease | ??? | mild improvement | decrease | good | mild increase |
| B | reduce | decrease | decrease | increase | increase | increase | ??? | increase | fair | increase |
| Sc | increase | increase | increase | decrease | decrease | decrease | negligible effect | decrease | good | decrease |
| Y | increase | increase | increase | decrease | decrease | decrease | ??? | decrease | good | decrease |
| Cr | decrease | increase | increase | increase | increase | ??? | worse than AlN | ??? | Inversion domains | decrease |
| Ti | decrease | decrease | increase | decrease | decrease | decrease | mild improvement | ??? | good | ??? |
| Ta | increase | increase | ??? | ??? | Flat. | ??? | ??? | ??? | good | Increase. Reports disagree |
| V | decrease | decrease | increase | decrease | decrease | ??? | ??? | ??? | Not optimized | ??? |
| Mg/Zr Mg/Hf | increase | increase | increase | decrease | decrease | decrease | ??? | ??? | good | decrease |

FIG.16

SUBSTITUTED ALUMINUM NITRIDE FOR IMPROVED ACOUSTIC WAVE FILTERS

CROSS-REFERENCE TO RELATED APPLICATIONS

This application claims priority under 35 U.S.C. § 120 as a continuation of U.S. patent application Ser. No. 16/026,436, titled "SUBSTITUTED ALUMINUM NITRIDE FOR IMPROVED ACOUSTIC WAVE FILTERS," filed Jul. 3, 2018, that claims priority under 35 U.S.C. § 119(e) to U.S. Provisional Patent application Ser. No. 62/529,742, titled "SUBSTITUTED ALUMINUM NITRIDE FOR IMPROVED ACOUSTIC WAVE FILTERS," filed Jul. 7, 2017, each of which is incorporated by reference herein in its entirety for all purposes.

BACKGROUND

Aluminum Nitride (AlN) is a piezoelectric material that has been used in Bulk Acoustic Wave (BAW) and Film Bulk Acoustic Resonator (FBAR) filters operating in the 1-5 GHz range. Larger group IIIA nitrides (e.g., GaN and InN) show a dramatically decreasing piezoelectric coefficient going down the series. The properties of AlN may be modified with substitutions for aluminum such as scandium. However, there is still a need for improved electromechanical coupling, higher dielectric constants, greater sound velocities and better temperature stability for these materials which may lead to improved properties of the BAW filters. As used herein, the term "BAW filter" includes FBAR filters.

Desirable properties in piezoelectric materials that may be used in acoustic wave filters include the following:

high speed of sound, for example, greater than 12,000 m/sec good coupling constant, for example, greater than 5% high dielectric constant to decrease size of device stable materials system and crystal structure for deposition and integration wide band gap which provides for the material to be a good insulator with low leakage The relationship between various parameters of BAW filters and the material properties of the piezoelectric material utilized in such filters include the following:

Increased bandwidth=Increased coupling factor $k^2$

Steep edges for filter=Increased quality factor Q

Filter thickness miniaturization=Increased sound velocity $v=(c_{33}/\rho)^{1/2}$; $c_{33}$=elastic modulus, $\rho$=material density.

Filter miniaturization in x-y plane=Increased dielectric constant

Low leakage current, Better insulator=Wide band gap

Filter temperature stability=Temperature stability of piezoelectric response Material properties of piezoelectric materials that are relevant to their performance when used in acoustic wave filters include the following:

$$k_t^2 = e_{33}^2/(c^D_{33}\varepsilon_{33}^s) = d_{33}^2/(c^E_{33}\varepsilon_{33}^T) = \pi^2/4(1-(f_s/f_p)) = K^2/(1+K^2) : K = e_{33}^2 \varepsilon_R \varepsilon_0 c^E_{33}$$

($k_t^2$ is the coupling coefficient, $e_{33}$ and $d_{33}$ are piezoelectric coefficients, $c^D_{33}$ and $c^E_{33}$ are elastic moduli, $\varepsilon_{33}$ is the dielectic constant, and $\varepsilon_R$ is the relative dielectric constant. $f_s$ and $f_p$ are the series and parallel resonance frequencies respectively.)

Signal to noise ratio $(SNR) = e_{31}^2/(\varepsilon_0\varepsilon_{33} \tan \delta)^{1/2}$ $f_{s, m}$ (GHz)=Frequency of the point of minimum impedance, which is close to and theoretically equal to the series resonance frequency $f_p$ (GHz)=Parallel resonance frequency Longitudinal sound velocity $v_1 = (c_{33}/\rho)^{1/2}$ FOM (Figure of Merit)=$k^2_{eff, m} \times Q$ A chart of impedance vs. frequency for an example of an acoustic wave filter showing locations of the series resonance frequency and the parallel resonance frequency is illustrated in FIG. 1.

At microwave frequencies, the dielectric constant of a material is dominated by ionic polarizability. A chart illustrating the dielectric polarizabilities of various trivalent cations vs. crystal radius is illustrated in FIG. 2. The Clausius-Mossetti relation for dielectric constant is as follows:

$$-\alpha_D = \tfrac{3}{4}\pi[(V_m)(\varepsilon'-1)/(\varepsilon'+2)]$$

$\alpha_D$=total ionic polarizability $V_m$=molar volume $\varepsilon'$=dielectric constant of material $$-\alpha_D = \Sigma \alpha_i$$

$\alpha_i$ indicates individual ionic polarizabilities.

$$-\varepsilon'(3V_m + 8\pi\alpha_D)/(3V_m - 4\pi\alpha_D)$$

Covalancy effects "blur" the ionic model. Doped AlN may show characteristics of both ionic and covalent bonding depending on the dopant(s) used.

AlN-based resonators show a temperature coefficient of frequency (TCF) drift in the range of −25 to −30 ppm/° C. For comparison, the TCF of GaN is about −18 ppm/° C. The TCF drift of the resonant frequency is dominated by the thermal drift in elastic modulus. Excess thermal drift of the resonant frequency is problematic in that a layer of silicon dioxide ($SiO_2$) may need to be deposited on the resonator to compensate for the TCF drift of the resonant frequency, leading to a reduced coupling factor ($k^2$) and spurious resonances. Doping AlN with a material such as scandium (Sc) does little to adjust the TCF.

The sound velocity of a material is related to the bulk modulus and density of the material per the equation:

$$v = (K/\rho)^{1/2}$$

K=Bulk Modulus of Material $\rho$=Density

The Longitudinal Sound Velocity of a material may be calculated by the formula:

$$v_1 = (c_{33}/\rho)^{1/2}$$

The acoustic velocities and other selected material parameters of various electromechanical materials are illustrated in the table of FIG. 3. 4H type hexagonal stacked silicon carbide (SiC) (Wurtzite) has a very high sound velocity (13,100 m/s). A solid solution of AlN with SiC, however, is not feasible.

Various nitrides, including AlN, gallium nitride (GaN), and indium nitride (InN) all assume the Wurtzite crystallographic structure with the space group $c^4_{6v}$. Space group refers to the 3 dimensional symmetry features shown in a periodic lattice. An illustration of this structure is shown in FIG. 4. The Wurtzite structure includes tetrahedrally coordinated cations and anions in an AB type hexagonal structure. The Wurtzite structure exhibits the highest symmetry possible that is compatible with spontaneous polarization. The key crystallographic parameters of the Wurtzite crystal structure include hexagonal c, hexagonal a, and bond length u. These parameters are illustrated in FIG. 4. In AlN, the c-axis bond is elongated relative to the others. These crystallographic parameters for AlN, GaN, and InN are as shown in Table 1 below:

TABLE 1

|     | a (Å) | c/a    | u (dimensionless) |
|-----|-------|--------|-------------------|
| AlN | 5.814 | 1.6190 | 0.380             |
| GaN | 6.040 | 1.6336 | 0.376             |
| InN | 6.660 | 1.6270 | 0.377             |

In the above table, u is the bond length. It is typically dimensionless and expressed as a fraction of the dimensional c parameter. The bond length in Å can be determined by (c/a) multiplied by u.

Wurtzite structured nitrides are more like II-VI materials (ZnO) rather than other III-V materials. Wurtzite structured nitrides have the same sign of piezoelectric coefficient and high Born effective charges (iconicity). Bond length (u) gets longer and c/a gets smaller from GaN→InN→AlN. Various material parameters, including spontaneous polarization, Born effective charge, and piezoelectric constants for various III-V Wurtzite nitrides AlN, GaN, and InN and II-VI Wurtzite oxides are illustrated in the table of FIG. 5A. Additional properties of AlN, GaN, and InN are illustrated in the table of FIG. 5B.

ZnO may be considered a model for Wurtzite structured III-V nitrides such as AlN or GaN. ZnO has greater piezoelectric coefficients than AlN or GaN, a higher effective charge than GaN, and a greater polarization response to strain than GaN. Enhanced piezoelectric response for smaller cations substituting for $Zn^{2+}$ in ZnO has been observed. Without being bound to a particular theory, it is believed that the piezoelectric response in ZnO occurs due to the rotation of non-colinear bonds around the c axis. The substitution of smaller highly charged ions for Zn in ZnO enhances this rotation (e.g., substituting $V^{5+}$ for $Zn^{2+}$). Not many ions are smaller than Al (for example, $Si^{4+}$) in AlN, although this mechanism may enhance piezoelectricity in GaN. The high charge on $V^{5+}$ or $Ta^{5+}$, possibly charge compensated with aluminum vacancies, may enhance this rotation effect in AlN. Without being bound to a particular theory, it is also believed that defects may play a role in enhancement of piezoelectricity in doped ZnO and AlN since charge balance and the Grimm-Summerfeld concept are violated by the presence of defects. Charge compensation may be accomplished by anti-site defects ($N_{Al}$), nitrogen interstitials ($N_i$) or Al vacancies in doped AlN.

AlN exhibits various properties that have made it attractive for use as a piezoelectric material in acoustic wave resonators and filters. These properties include:
  Wide Bandgap (6.2 eV)
  High Thermal Conductivity (2 W/cm-K)
  High Electrical Resistivity ($1 \times 10^{16}$ Ω-cm)
  High Breakdown Voltage ($5 \times 10^5$ V/cm)
  High Quality Factor (3,000 at 2 GHz for BAW)
  Moderate Coupling Coefficient (6.5% for BAW)
  Moderate Piezoelectric Coefficient ($e_{33}$=1.55 C/m2)
  High Longitudinal Acoustic Velocity (11,300 m/s for BAW)
  Low Propagation Losses
  Easy to prepare c-axis oriented films
  Chemically stable
  Compatible with IC-technology processes
Other than BN, very little work has been performed to characterize the piezoelectric properties of IIIA nitride-AlN solid solutions. The results of examination of the lattice constant and energy gap of $Al_xGa_{1-x}N$ solid solutions are illustrated in FIGS. 6A and 6B. $Al_xGa_{1-x}N$ exhibits a continuous solid solution.

Additional work comparing the properties of SiC, GaN, InN, ZnO, and CdSe has shown that decreasing Phillips Ionicity leads to larger elastic constants and larger sound velocities as illustrated in FIGS. 7A and 7B.

The properties of AlN doped with Sc have been investigated. ScN has a rock salt structure. The c/a ratio in the Wurtzite structure of AlN decreases with Sc additions (c/a for AlN is 1.601; c/a for $Al_{0.88}Sc_{0.12}N$ is 1.575). Modelling predicts that intermediate hexagonal crystallographic structures may be present in Sc-doped AlN. The change in crystallographic structure vs. c/a ratio for $Sc_{0.5}Al_{0.5}N$ is illustrated in FIGS. 8A and 8B. FIGS. 8A and 8B ultimately indicate the same c/a ratio and show the energy penalty paid in deviating from the optimum c/a ratio. The u parameter is larger around Sc sites. There is a shallow energy well in the c direction. Sc decreases covalency and increases piezoelectricity of the doped AlN. Density functional theory reveals that the substitution of Sc for Al leads to the softening of the Wurtzite phase. This is due to a competition of $Al^{3+}$ and $Sc^{3+}$ about the coordination of nitrogen. $Al^{3+}$ prefers tetrahedral coordination whereas $Sc^{3+}$ prefers 5 or 6 fold coordination. This leads to a frustrated system. Potential wells for ions become less deep and ionic displacements become larger as Sc is substituted for Al in AlN. With increased concentrations of Sc the $e_{33}$ piezoelectric coefficient increases while the $c_{33}$ elastic constant decreases. Larger, more electropositive ions like $Y^{3+}$, $Yb^{3+}$, etc. may also exhibit this effect. A comparison between various properties of AlN and $Al_{0.88}Sc_{0.12}N$ is illustrated in FIG. 8C and comparisons between the properties of AlN and AlN doped with other concentrations of Sc are illustrated in FIGS. 8D-8H.

Another doped AlN material that has been studied to some extent is $Y_xAl_{1-x}N$. Yttrium has a larger ionic radius, is more electropositive, and is less costly than scandium. Ab initio calculations based on density functional theory indicate high phase stability for the Wurtzite structure of $Y_xAl_{1-x}N$ (x=0.75). Nonetheless poor crystallinity has been observed in $Y_xAl_{1-x}N$ films. $Y_xAl_{1-x}N$ exhibits a large affinity for oxygen and water (YOOH groups). The band gap of $Y_xAl_{1-x}N$ is reduced from 6.2 eV (AlN) to 4.5 eV at x=0.22. A larger decrease in elastic coefficient and a larger increase in $d_{33}$ and $e_{33}$ is observed in $Y_xAl_{1-x}N$ than in Sc-doped AlN. The observed increase in permittivity for $Y_xAl_{1-x}N$ is similar to Sc-doped material. Charts illustrating the change in $\varepsilon_r$, $e_{33}$, $e_{31}$, $d_{33}$, and $d_{31}$ with different amounts of Y dopant in $Y_xAl_{1-x}N$ are illustrated in FIGS. 9A-9C.

There has been some work performed investigating the properties of AlN with coupled substitution of Mg and Zr, Mg and Ti, or Mg and Hf for Al. These materials exhibit improved piezoelectric coefficients relative to AlN but lower elastic coefficients (and likely sound velocities and Q). Charts illustrating the piezoelectric coefficients and elastic coefficients of AlN with coupled substitution of Mg and Zr, Mg and Ti, and Mg and Hf for Al for different dopant concentration are illustrated relative to piezoelectric coefficients and elastic coefficients of $Sc_xAl_{1-x}N$ in FIGS. 10A and 10B. Various properties of $(Mg_{0.5}Zr_{0.5})_{0.13}Al_{0.87}N$ and $(Mg_{0.5}Hf_{0.5})_{0.13}Al_{0.87}N$ vs. those of AlN are tabulated in FIG. 10C.

Numerous studies have been performed on Wurtzite $B_xAl_{1-x}N_y$ (0.001<x<0.70, 0.85<y<1.05). Films having up to 8% B have been successfully synthesized. Ab initio results indicate that increased covalency indicates increases in the elastic constant $c_{33}$ and the acoustic velocity with increasing B. Decreased ionicity leads to decreased $e_{33}$ and $k^2$ with increasing boron concentration. Dielectric constant is expected to decrease with increasing boron concentration. Boron addition to AlN leads to greater hardness, higher sound velocity, and a wider band gap than un-doped AlN films. Peak broadening is observed due to structural disorder and increased c/a ratio. The lattice constants of synthesized films decrease more than predicted by Vegard's law. Calculated and observed material properties for $B_xAl_{1-x}N_y$ with different quantities of B are illustrated in the graphs of FIGS. 11A-11F.

AlN with Cr or Mn substituted for Al in AlN has been investigated for use as dilute magnetic semiconductors. Sputtered films showed good c-axis orientation. The resistivity of $Al_{0.93}Cr_{0.07}N$ and $Al_{0.91}Mn_{0.09}N$ vs. temperature is illustrated in FIG. 12A. Additional material properties of Cr-doped AlN are illustrated in FIGS. 12B and 12C. The Mn-doped material shows a higher resistivity than Cr-doped material. Specifically with regard to the Cr-doped material, no 3d transition metal shows as marked a preference for octahedral coordination as $Cr^{3+}$. Therefore, forcing Cr into AlN would likely cause distortions potentially enhancing $k^2$. CrN is isostructural with ScN (halite structure). XPS binding energy indicates that Cr is present in Cr-doped AlN as $Cr^{3+}$. XANES peak for disallowed is-3d transition indicates Cr is present in low symmetry (tetrahedral) sites. Cr induces lattice strain and deforms the AlN Wurtzite structure. The sound velocity of $Al_{0.937}Cr_{0.063}N$ (11,490 m/s) is greater than that of un-doped AlN. $Al_{0.937}Cr_{0.063}N$ has been observed to exhibit a lower $k^2$ (5.6%) than AlN (7.9%), higher TCF values (−39 ppm/° C.), and higher ε' (Capacitance) 91 pF/m vs. 82 pF/m for substituted AlN, which is unexpected in that most other substitutions which decrease the coupling factor also decrease the dielectric constant (and thus the capacitance). Inversion domains (Regions of opposite polarity) have been observed. Ferromagnetism has been observed in $Cr^{3+}$ doped AlN.

Ti may also be substituted for Al in AlN. In such materials, the oxidation state of the Ti is unknown, although presumed to be $Ti^{3+}$. Al—Ti—N films form a single phase Wurtzite structure when Ti content is less than 16%. Large Ti atoms cause a shift in the 2 theta values for x-ray diffraction peaks. Crystal lattice parameters increase with increasing concentrations of Ti. Compressive strains reduce crystallinity when additional Ti is added. Ti—Al segregation has been observed above 4% Ti. Sound velocity and $k^2$ decrease with increasing Ti content. Dielectric constant increases with Ti content. The TCF of Ti-doped AlN is slightly lower than that of AlN. FIG. 13 illustrates the electromechanical coupling factor, longitudinal velocity, and dielectric constant of $Al_{(0.5-x)}Ti_xN_{0.5}$ as a function of x.

Additional elements that may be substituted for Al in AlN include tantalum (Ta) and vanadium (V). The oxidation states of these elements when substituting for Al in AlN are assumed to be $Ta^{3+}$ and $V^{3+}$. The crystallographic c parameter is reduced when AlN is doped with V, but increased when AlN is doped with Ta. When AlN is doped with more than about 7% V, the crystallinity of the material is destroyed. A VN phase begins to appear at 6.4% V. For Ta, segregation is observed when Ta is doped into AlN at 3.2% or more. Acoustic velocity and $k^2$ drop as V content increases, but ε' increases. Charts illustrating changes in acoustic velocity and dielectric constant of AlN doped with varying amounts of V and Ta are illustrated in FIGS. 14A and 14B, respectively.

The limit for Al substitution by Ta in AlN appears to be 5.1 atomic percent. Ta may be substituted for Al in AlN with excellent c-axis orientation. Like $Sc^{3+}$, $Ta^{5+}$ is larger than $Al^{3+}$. However, unlike with $Sc^{3+}$ substitution, the c/a ratio does not decrease with substitution of $Al^{3+}$ in AlN with $Ta^{5+}$. Instead, both c and a lattice constants increase. FIG. 14C illustrates how the c and a lattice constants in AlN change with different amounts of Ta doping. Raman, TEM and XPS suggest no second phases or compositionally inhomogeneous regions appear with Ta substitution for Al in AlN. Elastic losses within the Ta—Al—N crystal lattice may be due to disorder due to defects. $Ta^{5+}$ is less electropositive than $Sc^{3+}$, however a large increase in $d_{33}$ is observed in Ta-doped AlN. (See FIG. 14D.) It has been hypothesized that the increase in $d_{33}$ observed in Ta-doped AlN may be due to ease of bond bending. Small ions promote bond rotation. Small ions may be easily moved under an applied electric field (e.g., $V^{5+}$ in ZnO). A similar effect may apply to $Ta^{5+}$ in AlN because of large lattice expansion. $Ta^{5+}$ is not expected to be that much smaller than $Al^{3+}$ so it is uncertain why there is an increase in the $d_{33}$ piezoelectric coefficient. This is possibly associated with charge compensating defects.

In some examples, AlN may be doped with oxygen. For example, oxygen may be present in sputtering gas used during deposition of AlN-based films. Despite the increasing ionicity of oxygen, the magnitude of the piezoelectric coefficient of oxygen-doped AlN does not increase. Without being bound to a particular theory, it is possible that oxygen defects in AlN may be compensated by aluminum vacancies ($\square_{Al}$). Further, the presence of oxygen in AlN may cause second phase $Al_2O_3$ to form. It thus may be difficult to control the anion stoichiometry. Accordingly, in doped AlN, it may be preferable to avoid anion mixing, but rather to make all adjustments on a cation basis.

The addition of dopants into AlN may cause one or more of a number of types of crystallographic defects. One type of defect involves electronic substitutions. For example, Si substituted for Al in AlN may act as a deep level donor (320 meV) which may reduce the conductivity of the material, while C substituted for Al in AlN may act as a deep level acceptor (500 meV). Point defects include vacancies, interstitials, and anti-site defects. In AlN, vacancies are more energetically favorable than interstitials or anti-site defects. For Al vacancies atomic displacement away from the vacancy is observed. For N vacancies atomic displacement toward the vacancy is observed. Stacking faults in AlN include {1120} stacking fault configurations. Stacking faults may be a preferred region for substitutional ions or Al vacancies. Systematic vacancies may be caused by substitution of Al in AlN by some elements. For example, $Ta^{5+}$ and $Zr^{4+}$ doping of AlN would be compensated for by native defects such as Al vacancies ($V_{Al}$ or $\square_{Al}$). Smaller ions than $Al^{3+}$ or $Ta^{5+}$ may form elastically driven defect couples with $2\square_{Al}$-$3Ta_{Al}$. The $\square_{Al}$ and $Ta_{Al}$ vacancies or substitutions may expand nearest neighbor N tetrahedral. $Si^{4+}$ may contract nearest neighbor N tetrahedral forming defect couples with $V_{Al}$.

SUMMARY

In accordance with a first aspect, there is provided a piezoelectric material. The piezoelectric material comprises AlN doped with cations of one or more elements selected from the group consisting of: one of Sb, Ta, Nb, or Ge; Cr in combination with one or more of B, Sc, Y, Sm, Eu, Gd, Tb, Dy, Ho, Er, Tm, or Yb; one of Nb and Ta in combination with one of Li, Mg, Ca, Ni, Co, and Zn; Ca in combination with one of Si, Ge, Ti, Zr, and Hf; Mg in combination one of Si, Ge, and Ti; and one or more of Co, Sb, Ta, Nb, Si, or Ge in combination with one or more of Sm, Eu, Gd, Tb, Dy, Ho, Er, Tm, or Yb. The cations at least partially substitute for Al in the crystal structure of the piezoelectric material.

In some embodiments, the piezoelectric material has one of the formulas $Al_{1-x}Ge_{3/4x}\square_{1/4x}N$ or $Al_{1-5/3x}Ta^{5+}{}_{x}\square_{2/3x}N$, Q representing a vacancy in an Al site in the crystal structure of the piezoelectric material, 0<x<0.25.

In some embodiments, the piezoelectric material has the formula $Al_{1-2x}B_xCr_xN$ 0<x<0.15.

In some embodiments, the piezoelectric material has the formula $Al_{1-5/3x-3y}Mg_{2y}Ta_{x+y}\square_{2/3x}N$, Q representing a vacancy in an Al site in the crystal structure of the piezoelectric material, 1>5/3x+3y, 0<x<0.3, 0<y<0.25.

In some embodiments, the piezoelectric material has the formula $Al_{1-2x}Mg_xSi_xN$ 0<x<0.15.

In some embodiments, the piezoelectric material has the formula $Al_{1-x-y}Cr^{3+}{}_xM^{III}{}_yN$, $M^{III}=Sc^{3+}, Y^{3+}, Sm^{3+} \ldots Yb^{3+}$, $Sm^{3+} \ldots Yb^{3+}$=any one or more of the Lanthanides with atomic numbers from 62-70.

The piezoelectric material may have a Wurtzite crystal structure.

In some embodiments, an acoustic wave resonator includes the piezoelectric material. The acoustic wave resonator may be configured as a solidly mounted resonator. The acoustic wave resonator may be configured as a film bulk acoustic resonator.

In some embodiments, a filter includes the acoustic wave resonator. The filter may have a passband in the radio frequency band.

In some embodiments, an electronic device module includes the filter.

In some embodiments, an electronic device includes the electronic device module. The electronic device module may be a radio frequency electronic device module.

BRIEF DESCRIPTION OF THE DRAWINGS

FIG. 3 is a table of selected material parameters of various electromechanical materials;

FIG. 5A is a table of selected material parameters for various III-V Wurtzite nitrides and II-VI Wurtzite oxides;

FIG. 5B is a table of selected material parameters of AlN, GaN, and InN;

FIG. 8C is a table of select material properties of AlN and $Al_{0.88}Sc_{0.12}N$.

FIG. 8D is a table of select material properties of AlN and AlN doped with various concentrations of Sc.

FIG. 10C is a table of selected material properties of AlN, $(Mg_{0.5}Zr_{0.5})_{0.13}Al_{0.87}N$ and $(Mg_{0.5}Hf_{0.5})_{0.13}Al_{0.87}N$;

FIG. 16 is a table indicating the expected effect of various dopants on selected material properties of doped AlN;

DETAILED DESCRIPTION

Figure 1:
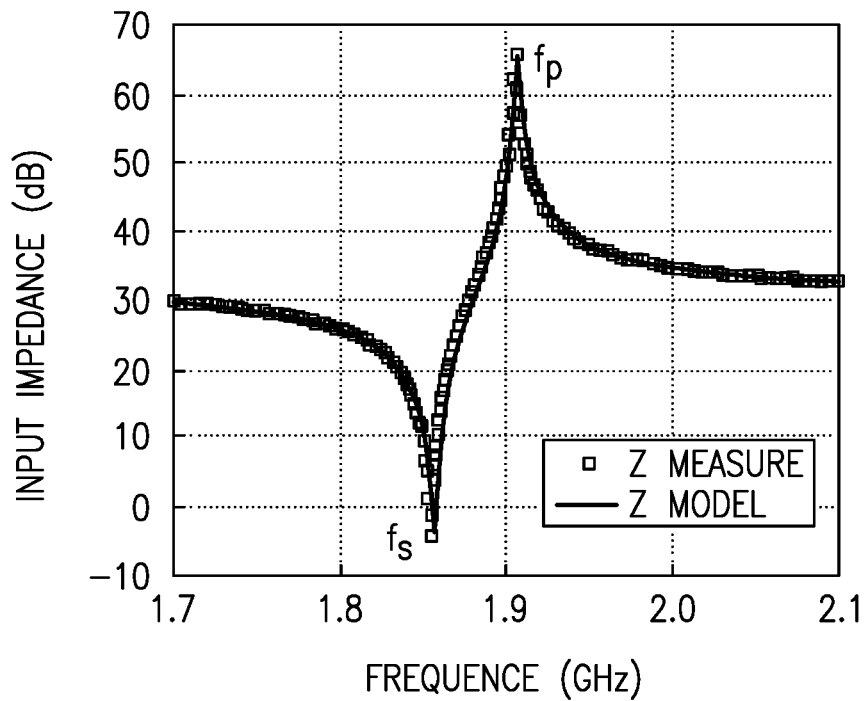
FIG. 1 is a chart of impedance vs. frequency for an example of an acoustic wave filter.
Figure 2:
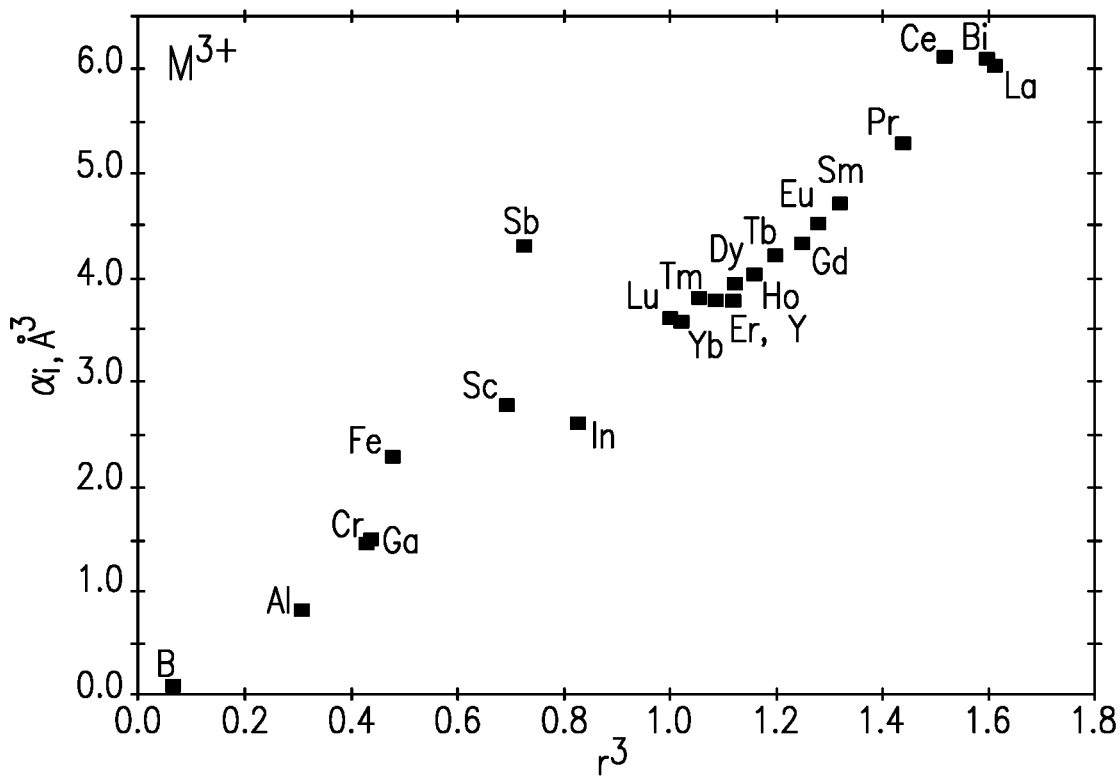
FIG. 2 is a chart illustrating the dielectric polarizabilities of various trivalent cations vs. crystal radius.
Figure 4:
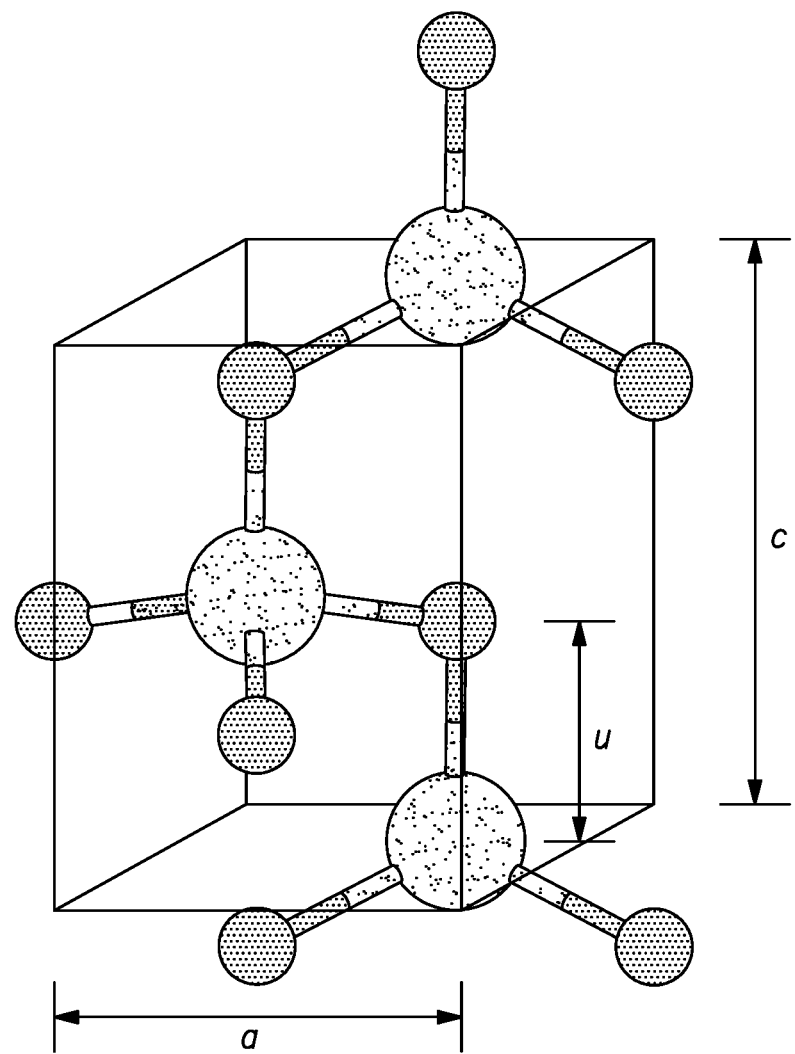
FIG. 4 illustrates the Wurtzite crystallographic structure.
Figure 6A:
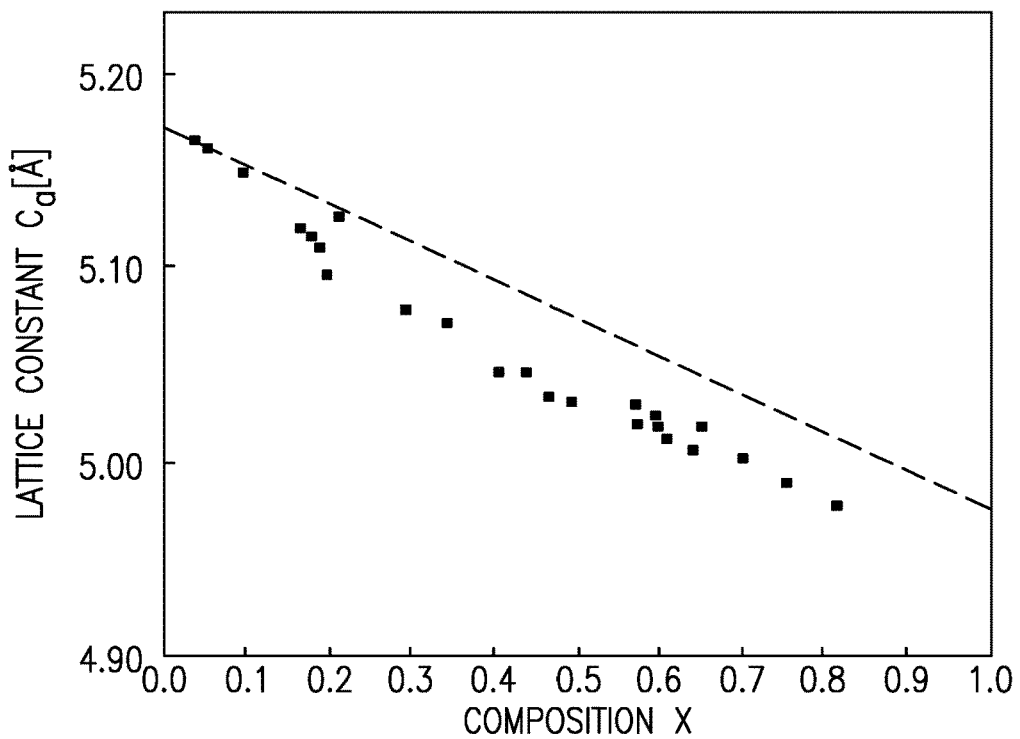
FIG. 6A is a chart of lattice constant vs. x in $Al_xGa_{1-x}N$.
Figure 6B:
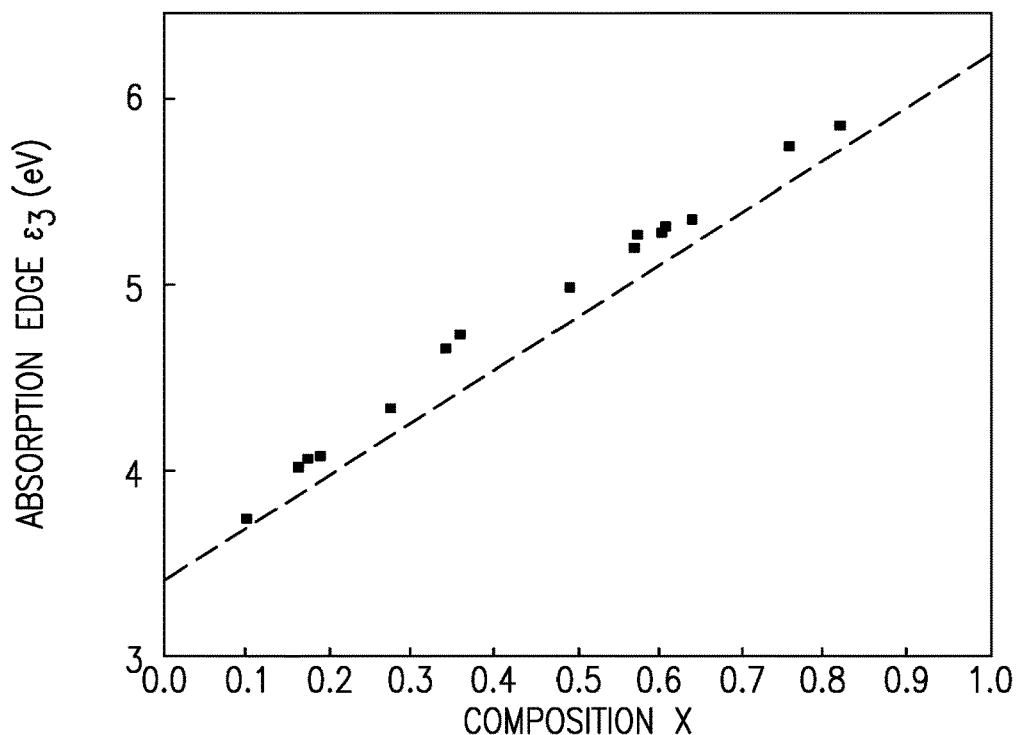
FIG. 6B is a chart of energy gap vs. x in $Al_xGa_{1-x}N$.
Figure 7A:
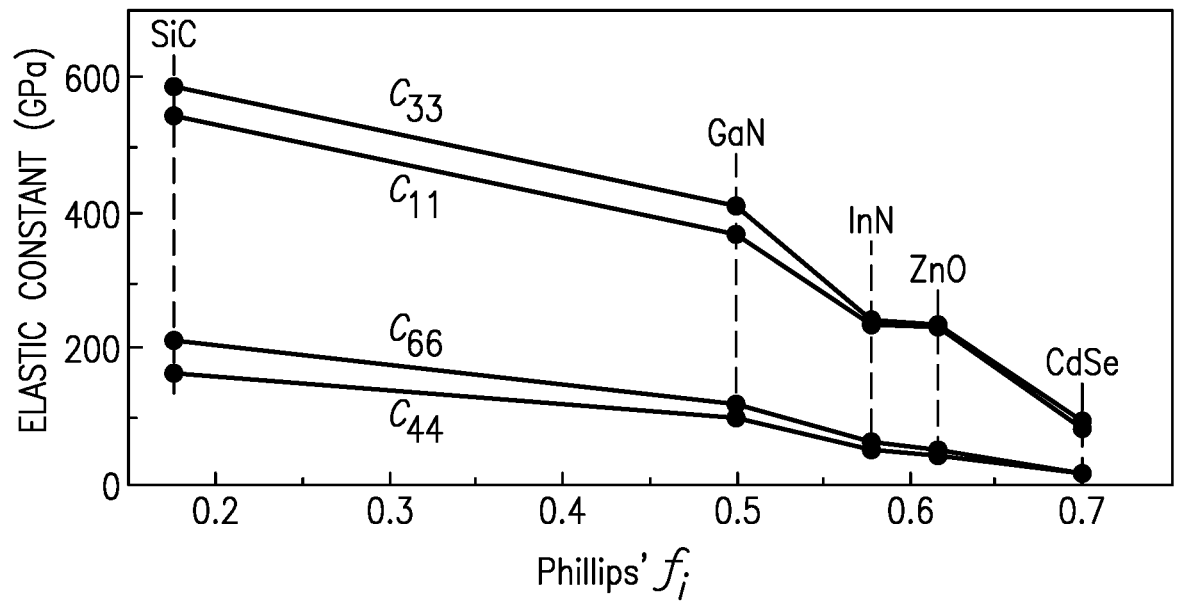
FIG. 7A is a chart of elastic constant vs. Phillips Ionicity for selected compounds.
Figure 7B:
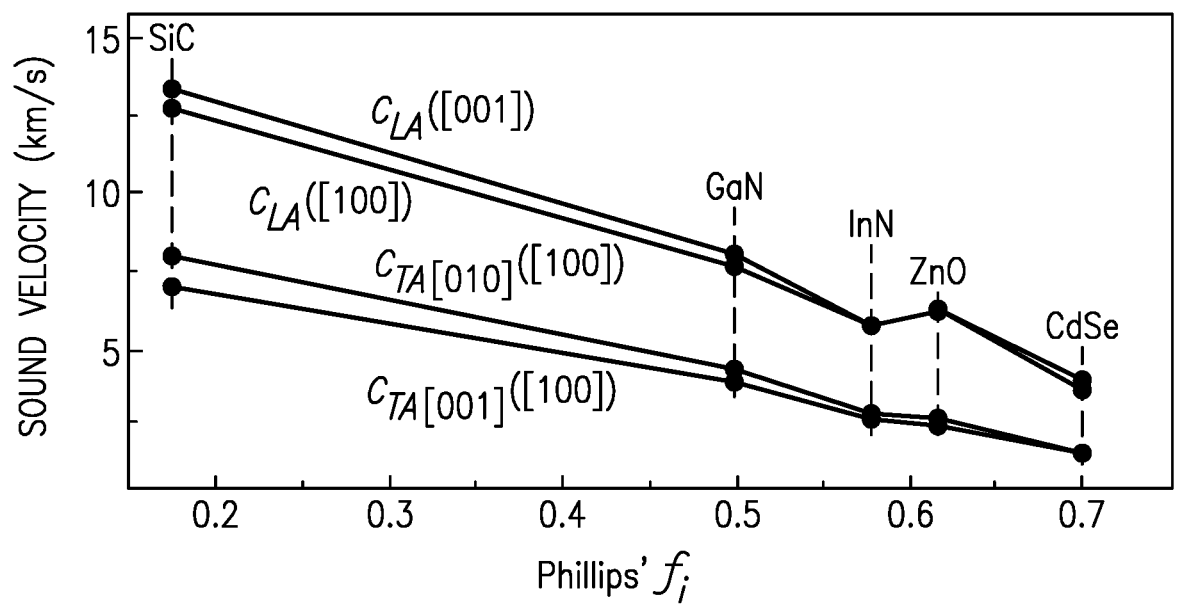
FIG. 7B is a chart of sound velocity vs. Phillips Ionicity for selected compounds.
Figure 8A:
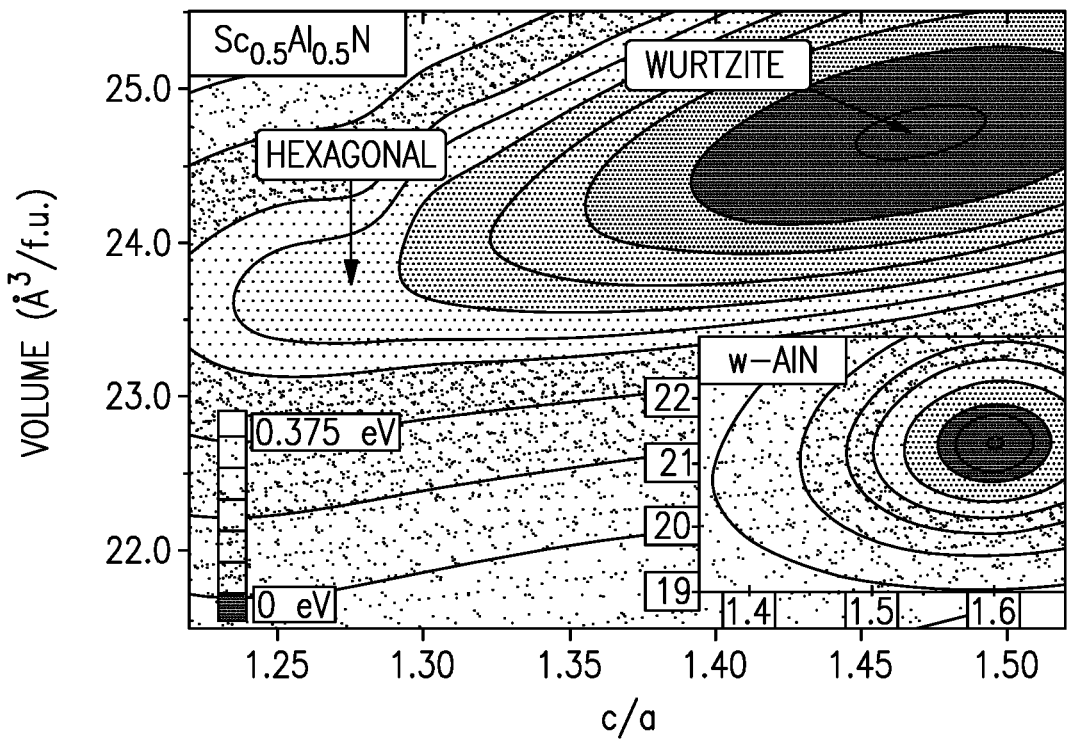
FIG. 8A is a chart illustrating the change in crystallographic structure vs. c/a ratio in $Sc_{0.5}Al_{0.5}N$.
Figure 8B:
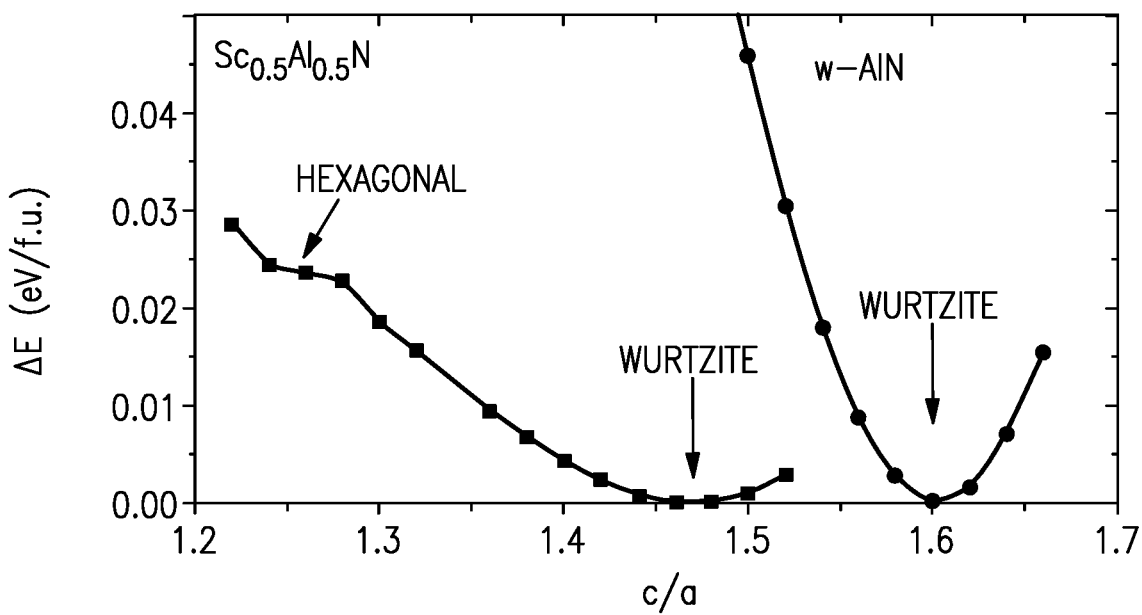
FIG. 8B is another chart illustrating the change in crystallographic structure vs c/a ratio in $Sc_{0.5}Al_{0.5}N$.
Figure 8E:
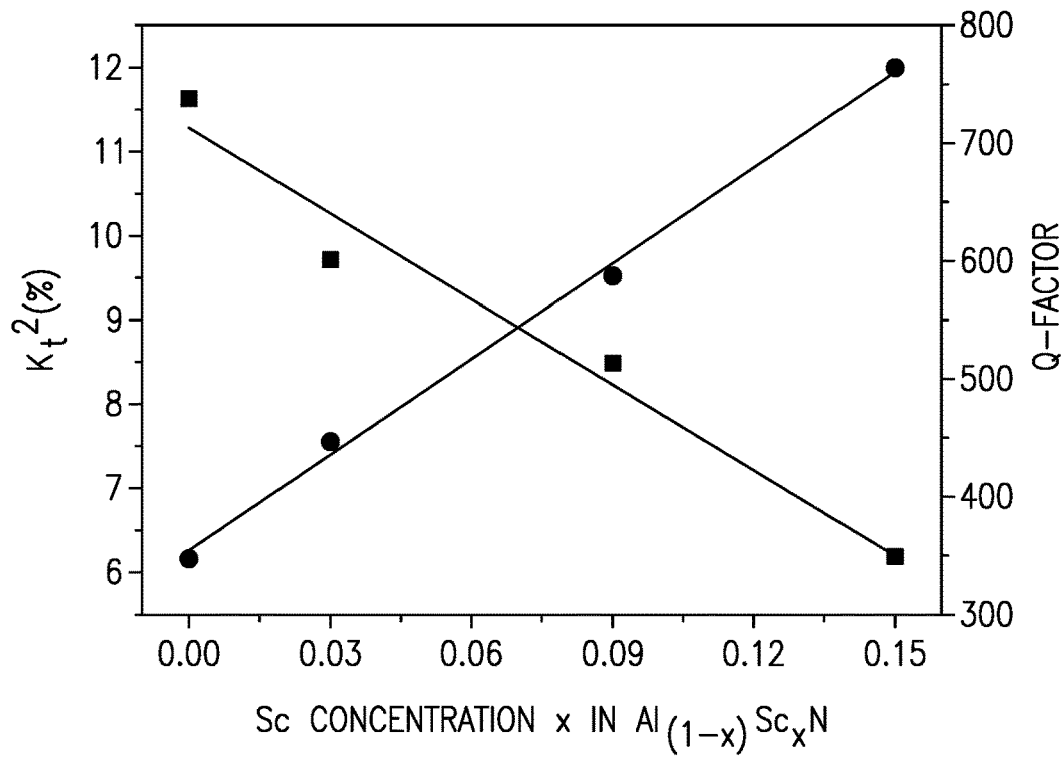
FIG. 8E is a chart of $k^2$ and Q-factor for AlN doped with various concentrations of Sc.
Figure 8F:
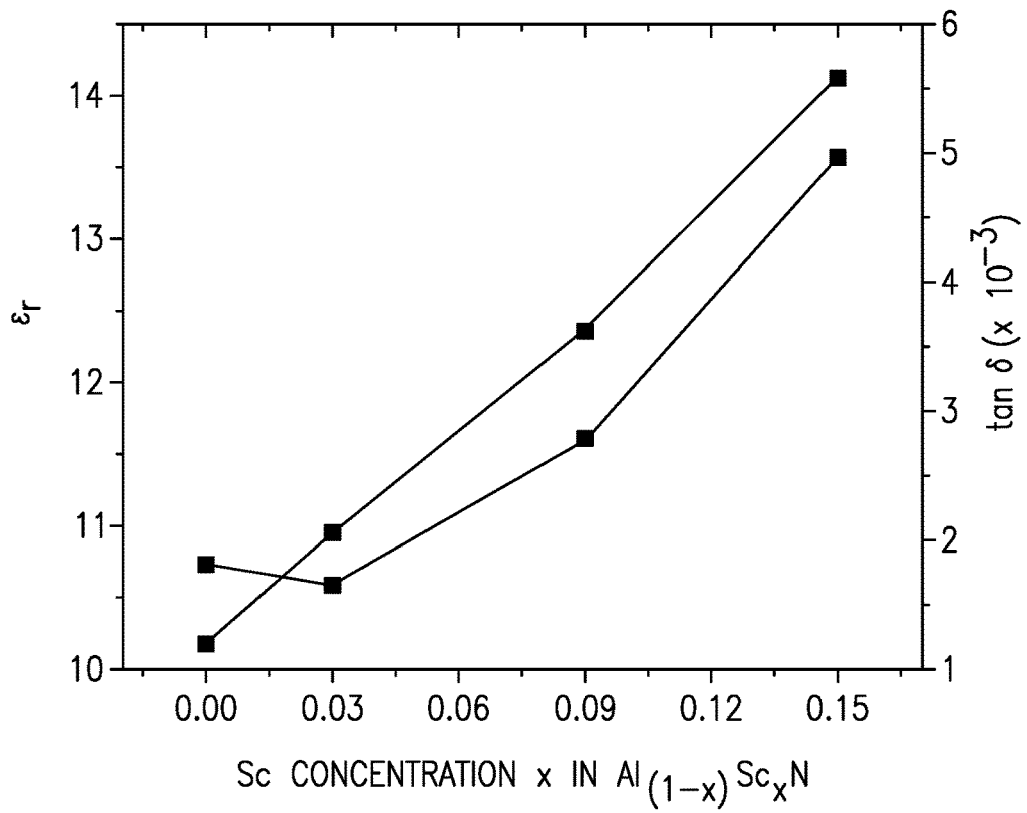
FIG. 8F is a chart of $\varepsilon_r$ and tan δ for AlN doped with various concentrations of Sc.
Figure 8G:
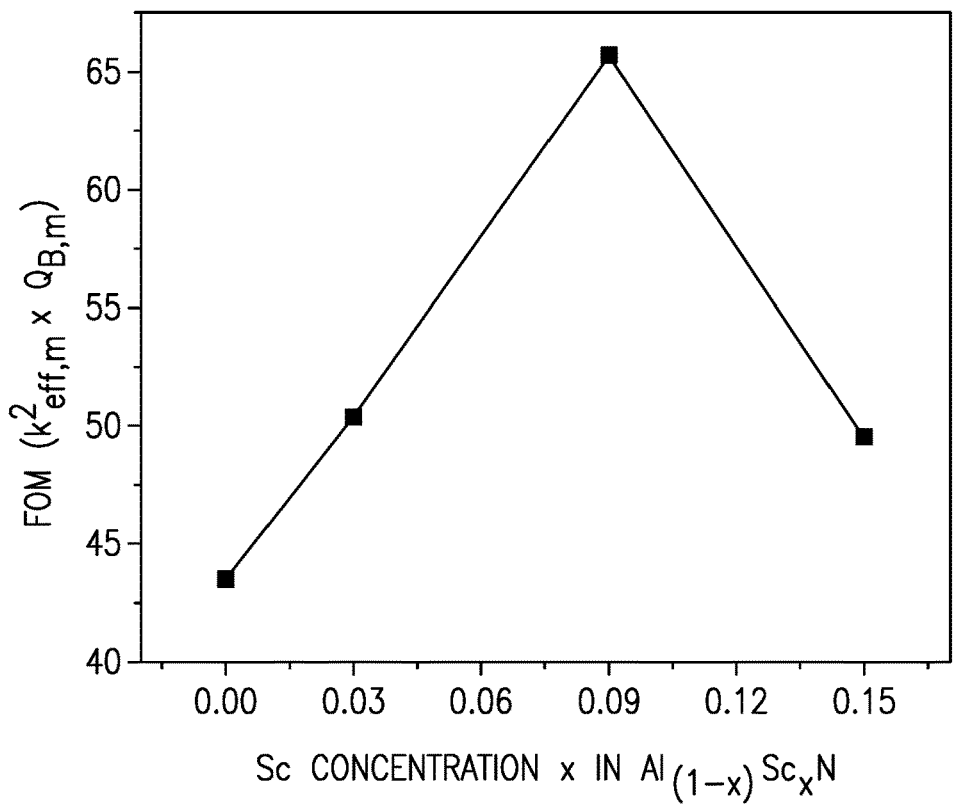
FIG. 8G is a chart of FOM for AlN doped with various concentrations of Sc.
Figure 8H:
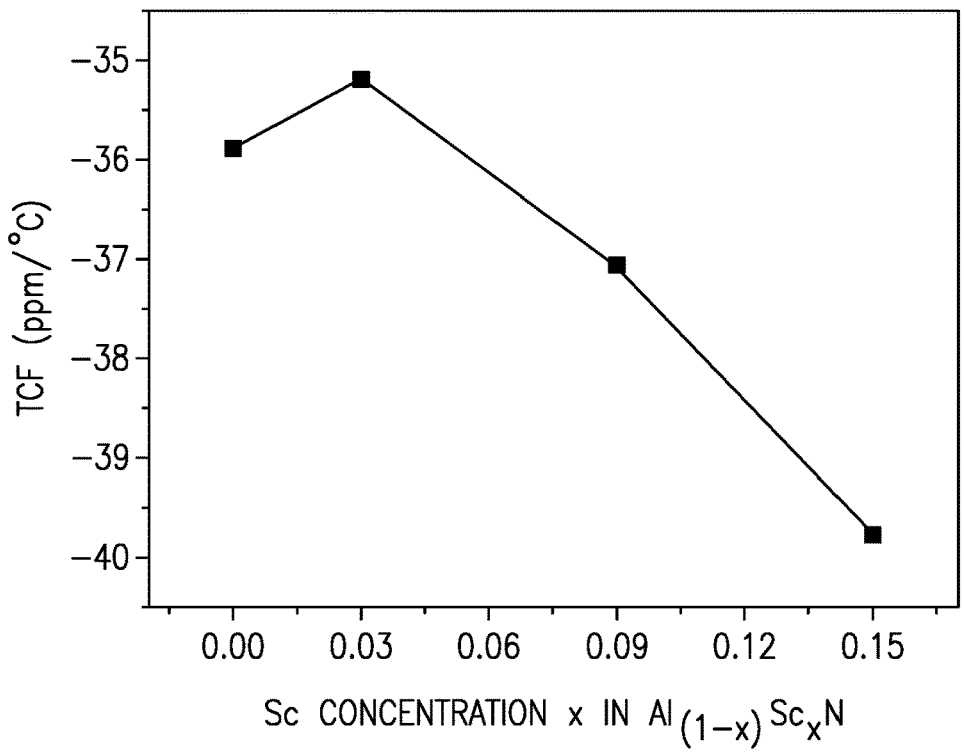
FIG. 8H is a chart of TCF for AlN doped with various concentrations of Sc.
Figure 9A:
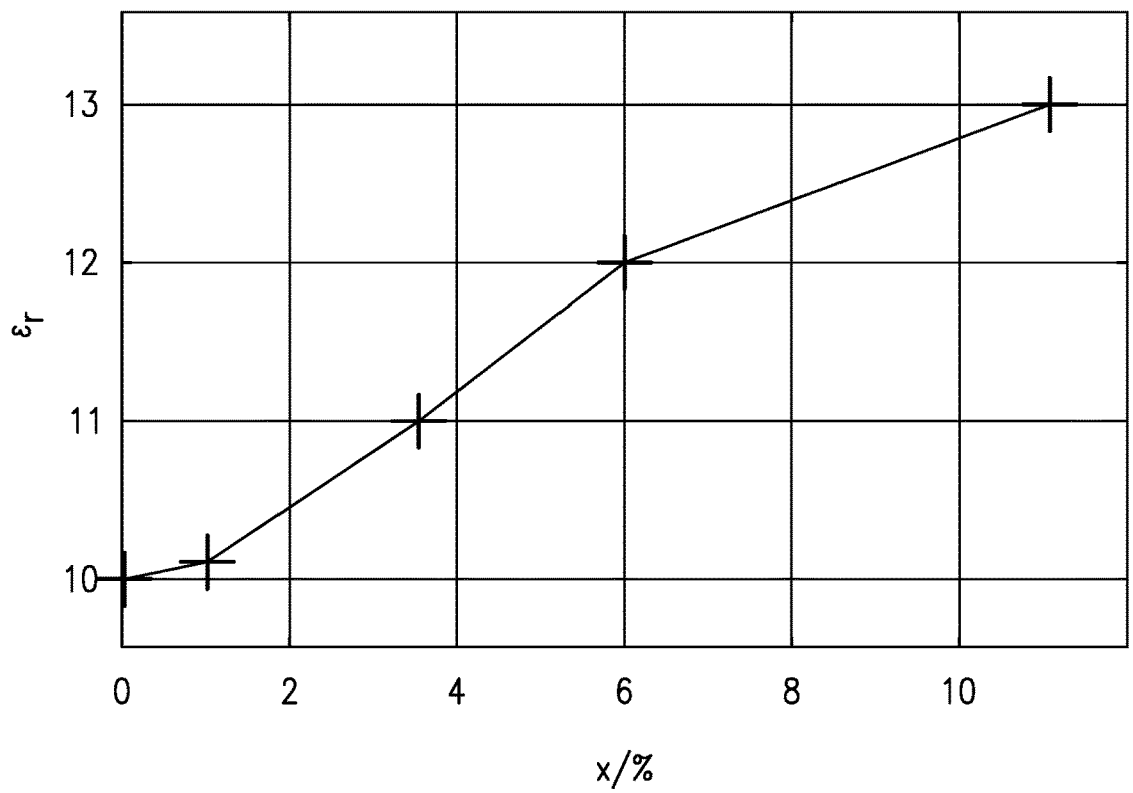
FIG. 9A is a chart of $\varepsilon_r$ for AlN doped with various concentrations of Y.
Figure 9B:
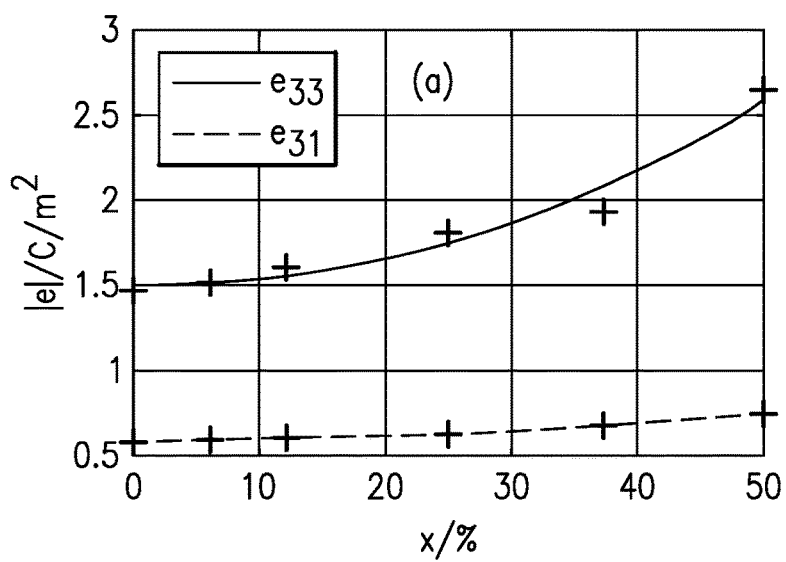
FIG. 9B is a chart of $e_{33}$ and $e_{31}$ for AlN doped with various concentrations of Y.
Figure 9C:
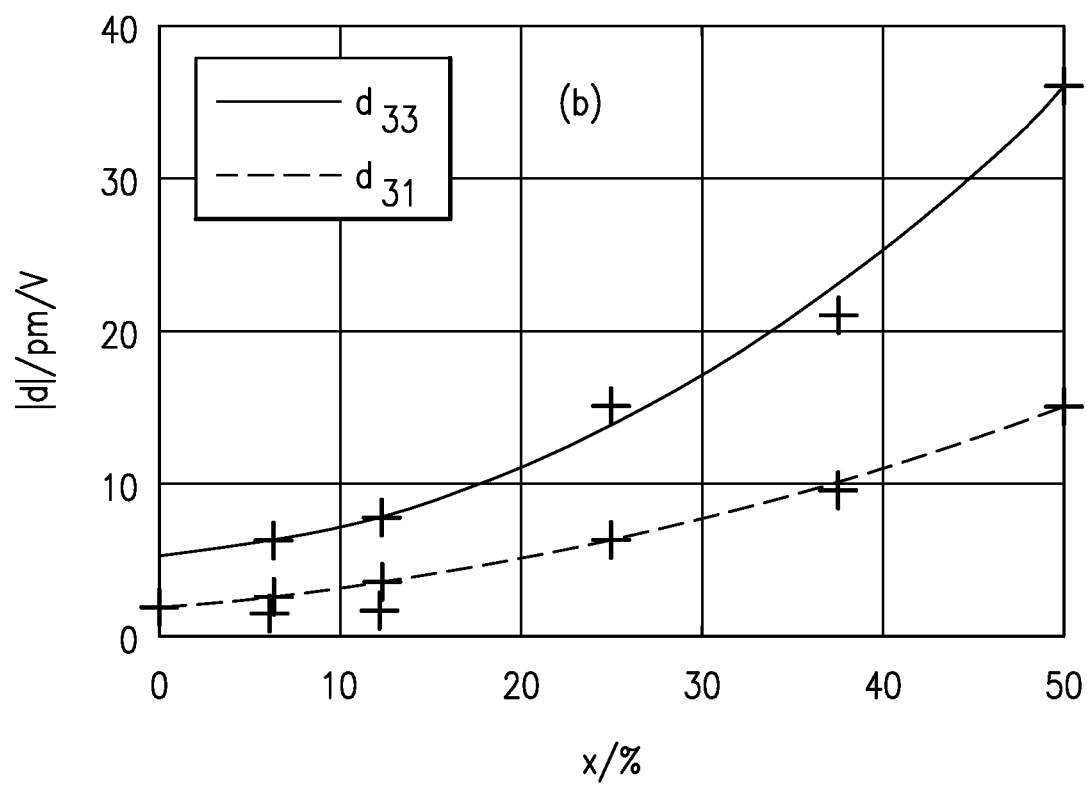
FIG. 9C is a chart of $d_{33}$, and $d_{31}$ for AlN doped with various concentrations of Y.
Figure 10A:
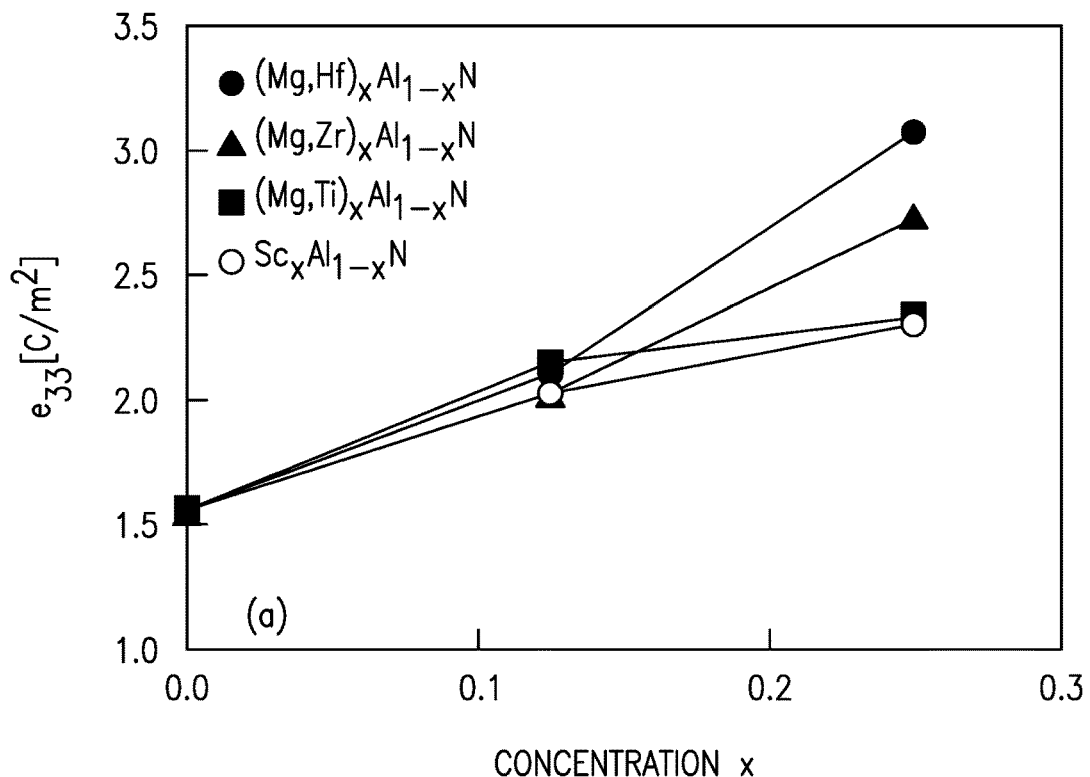
FIG. 10A is a chart of $e_{33}$ vs. dopant concentration for AlN doped with Sc, and with coupled substitution of Mg and Zr, Mg and Ti, and Mg and Hf for Al.
Figure 10B:
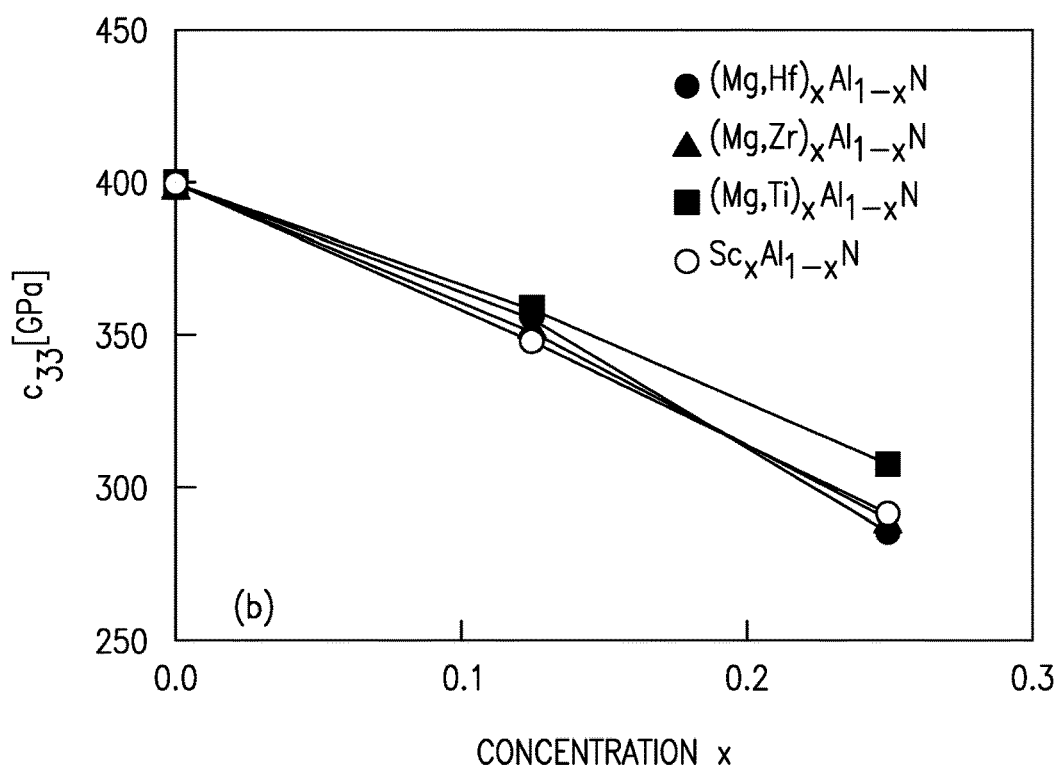
FIG. 10B is a chart of $c_{33}$ vs. dopant concentration for AlN doped with Sc, and with coupled substitution of Mg and Zr, Mg and Ti, and Mg and Hf for Al.
Figure 11A:
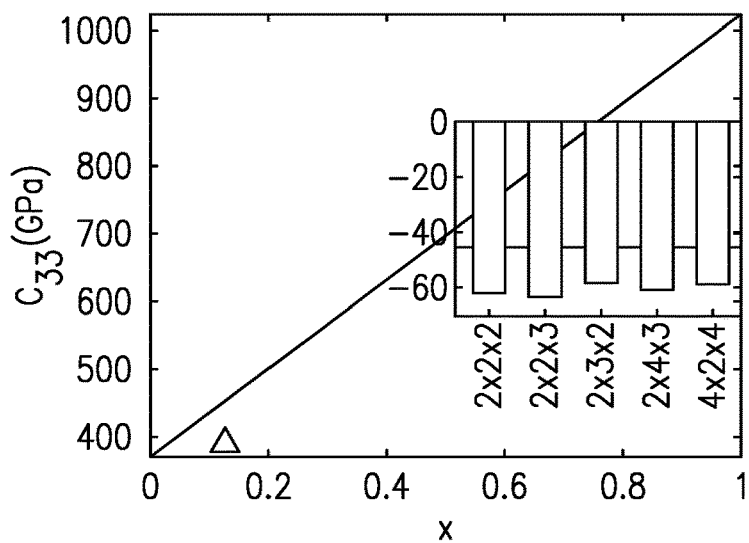
FIG. 11A is a chart of $c_{33}$ vs. boron concentration in boron-doped AlN.
Figure 11B:
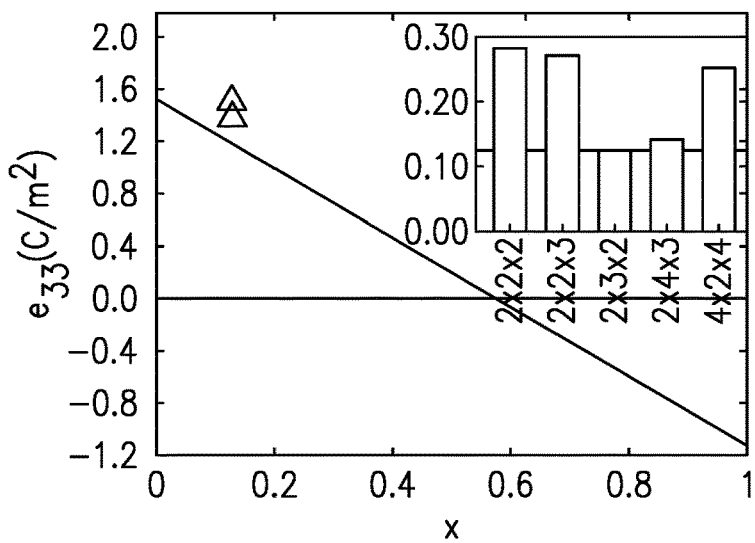
FIG. 11B is a chart of $e_{33}$ vs. boron concentration in boron-doped AlN.
Figure 11C:
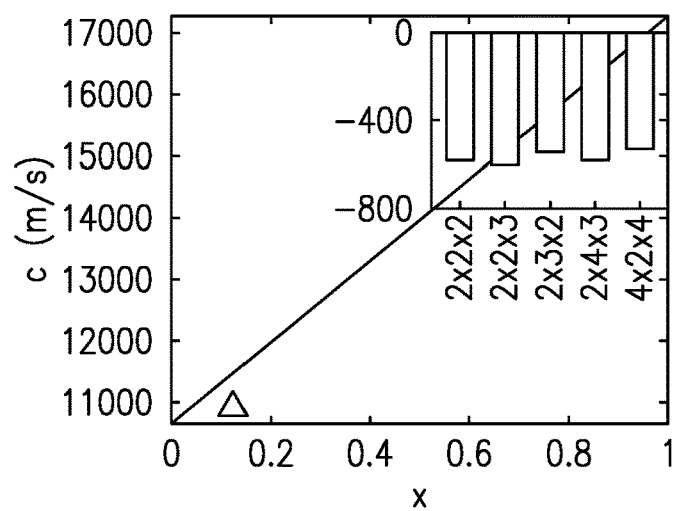
FIG. 11C is a chart of crystal lattice parameter c vs. boron concentration in boron-doped AlN.
Figure 11D:
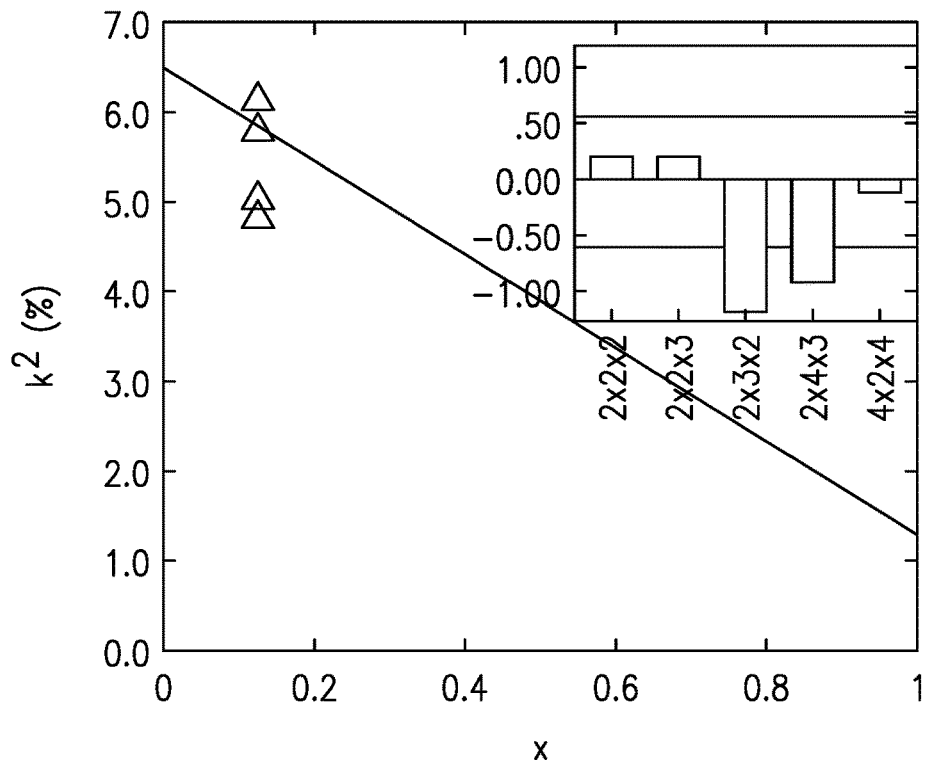
FIG. 11D is a chart of $k^2$ vs. boron concentration in boron-doped AlN.
Figure 11E:
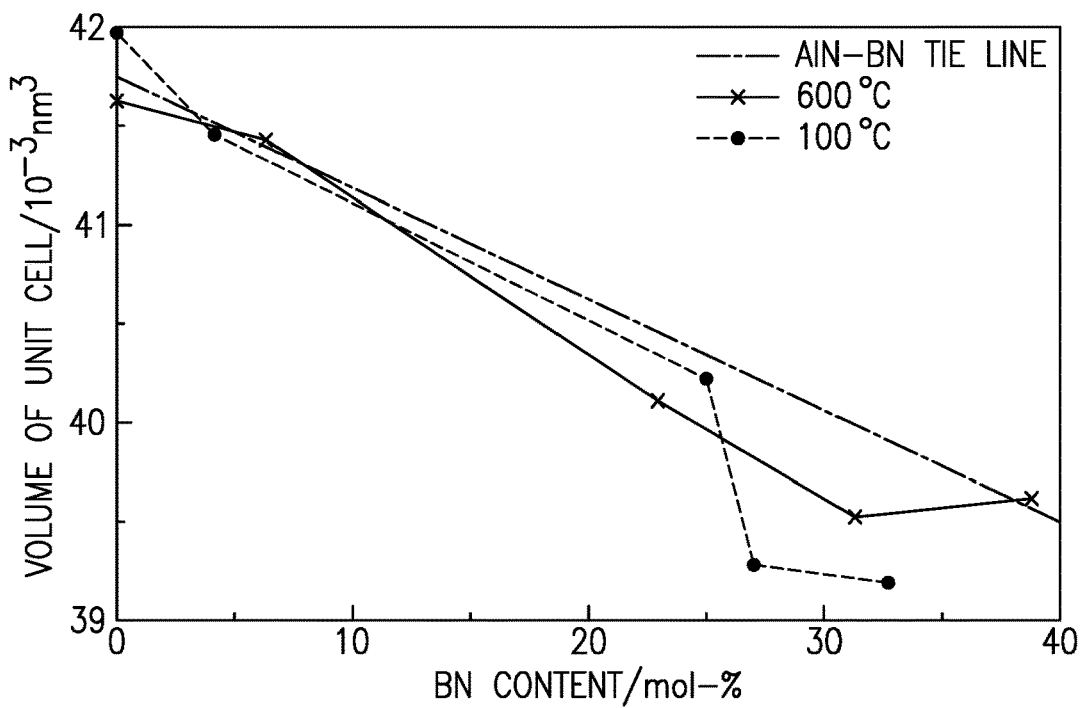
FIG. 11E is a chart of crystal unit cell volume vs. boron concentration in boron-doped AlN.
Figure 11F:
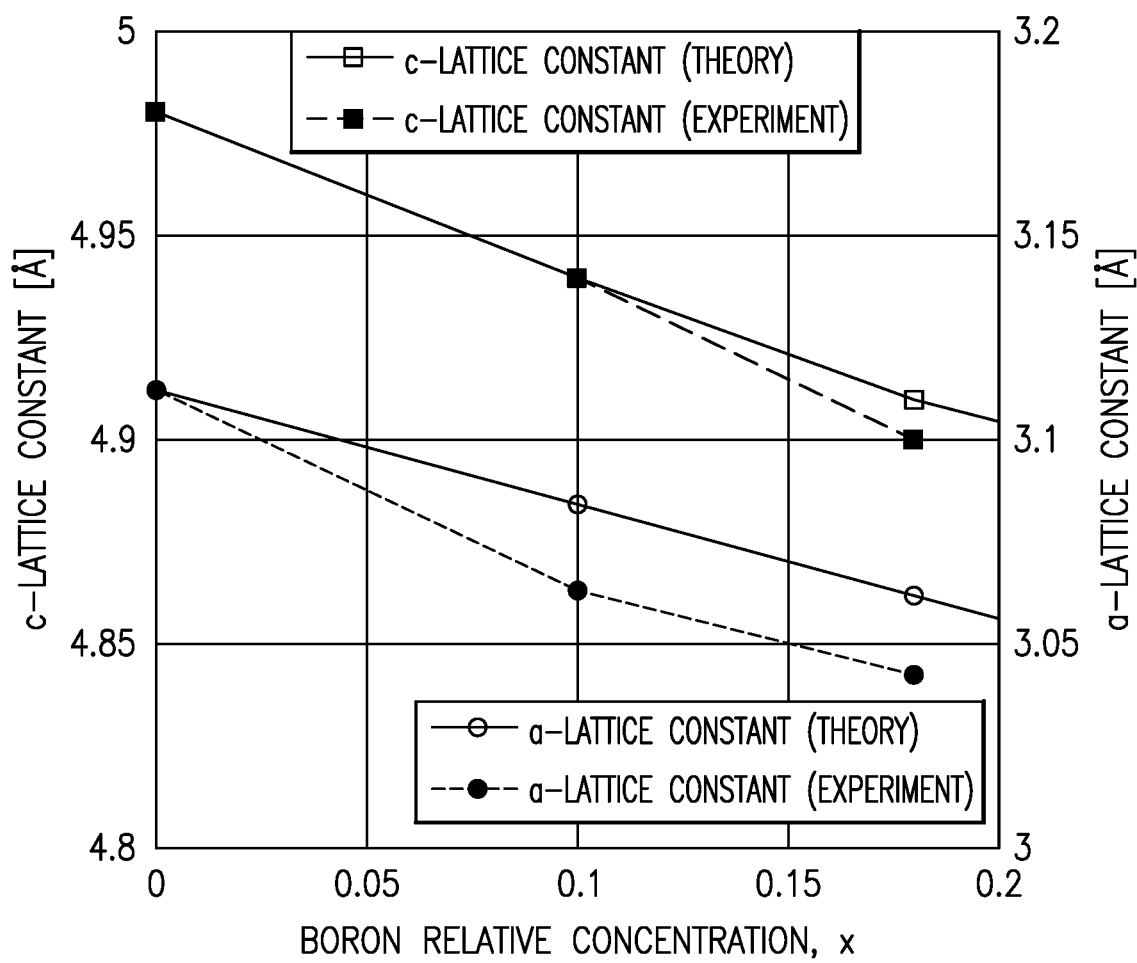
FIG. 11F is a chart of crystal lattice parameters c and a vs. boron concentration in boron-doped AlN.
Figure 12A:
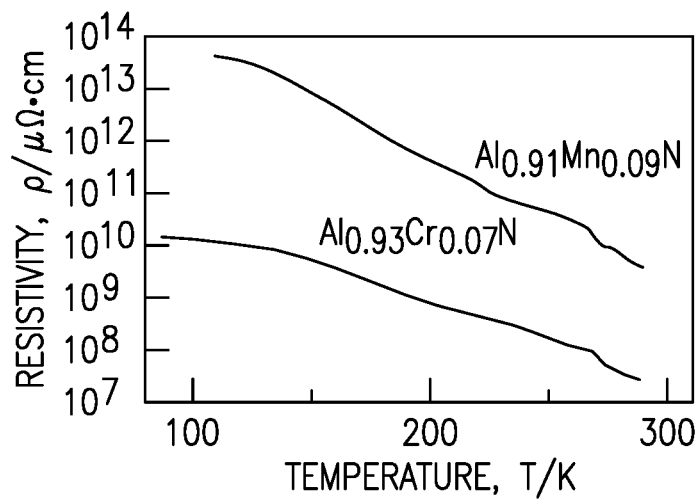
FIG. 12A is a chart of material resistivity vs. temperature for $Al_{0.93}Cr_{0.07}N$ and $Al_{0.91}Mn_{0.09}N$.
Figure 12B:
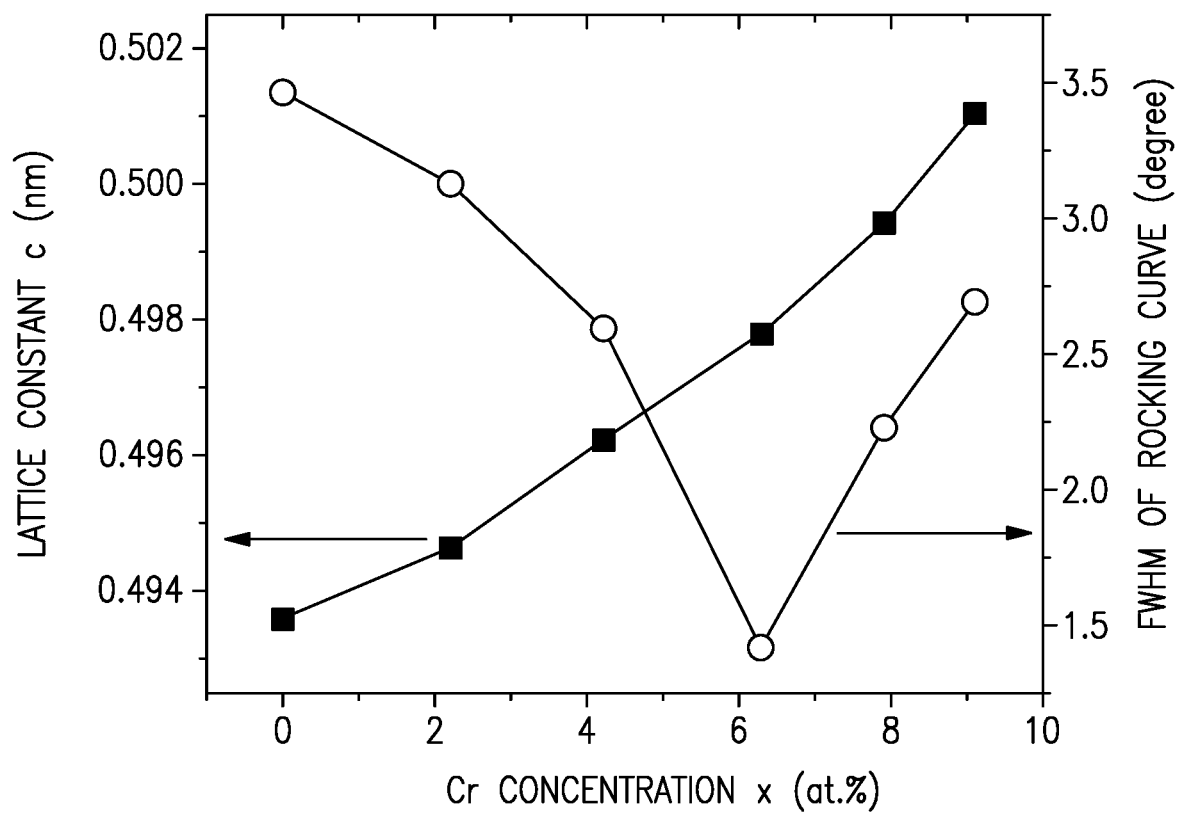
FIG. 12B is a chart of lattice constant vs. Cr concentration in Cr-doped AlN.
Figure 12C:
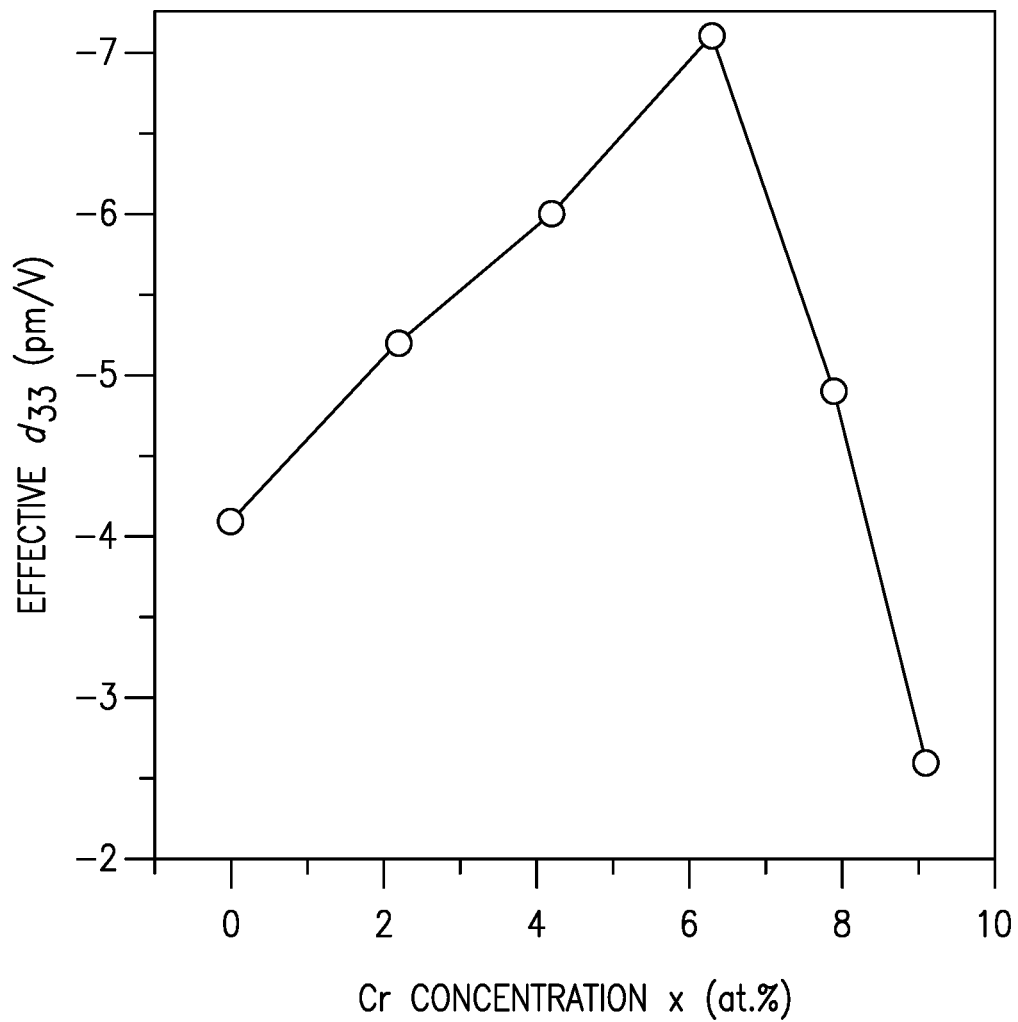
FIG. 12C is a chart of effective $d_{33}$ vs. Cr concentration in Cr-doped AlN.
Figure 13:
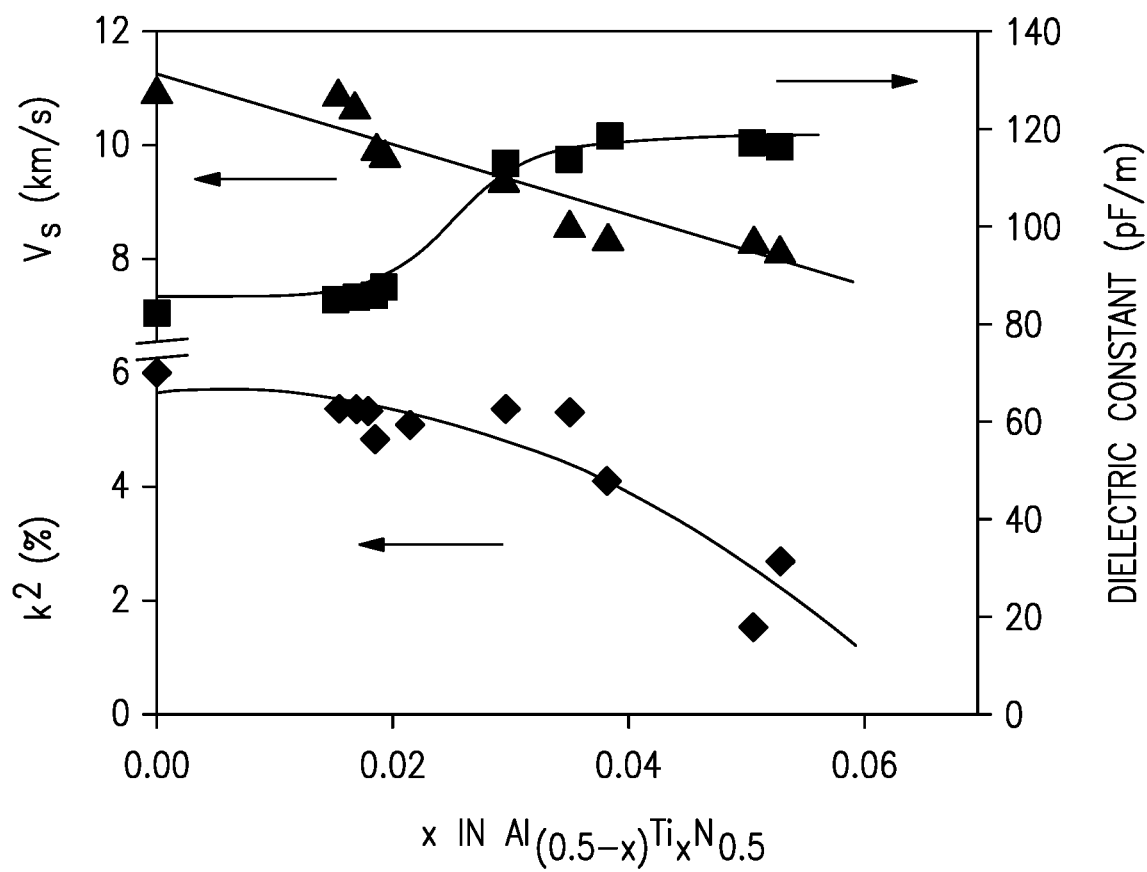
FIG. 13 is a chart of $k^2$, $v_s$, and dielectric constant vs. Ti concentration in Ti-doped AlN.
Figure 14A:
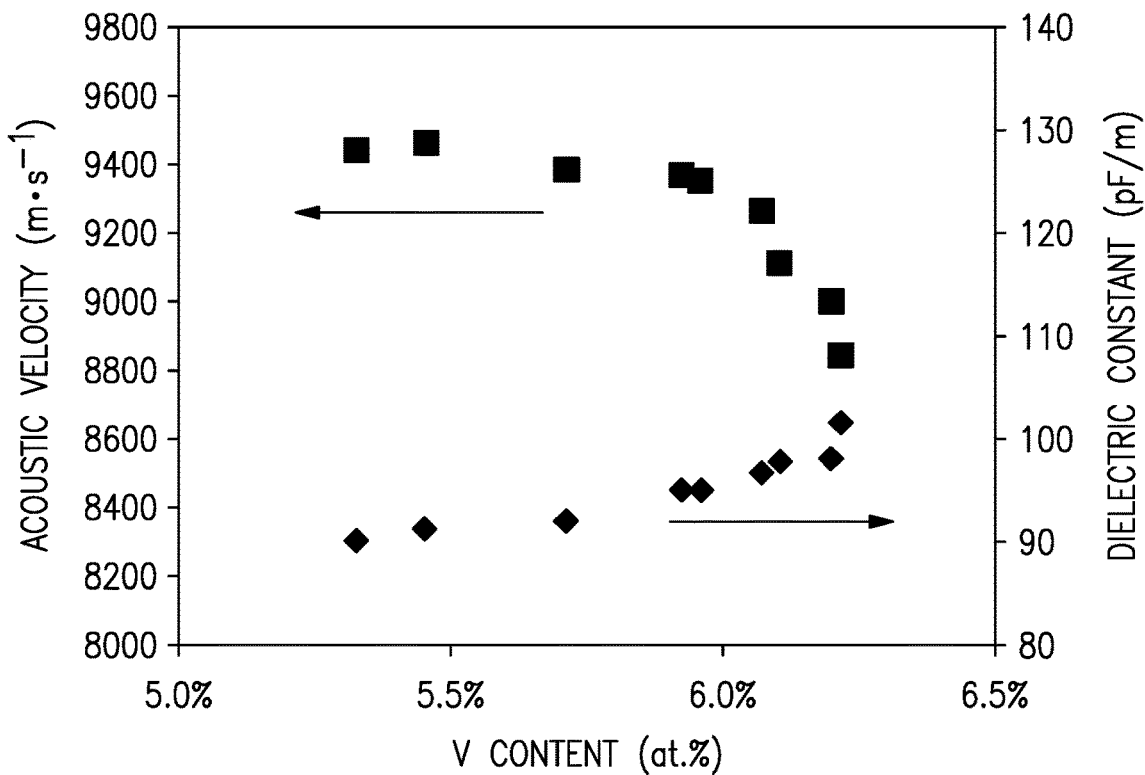
FIG. 14A is a chart of acoustic velocity and dielectric constant vs. V content in V-doped AlN.
Figure 14B:
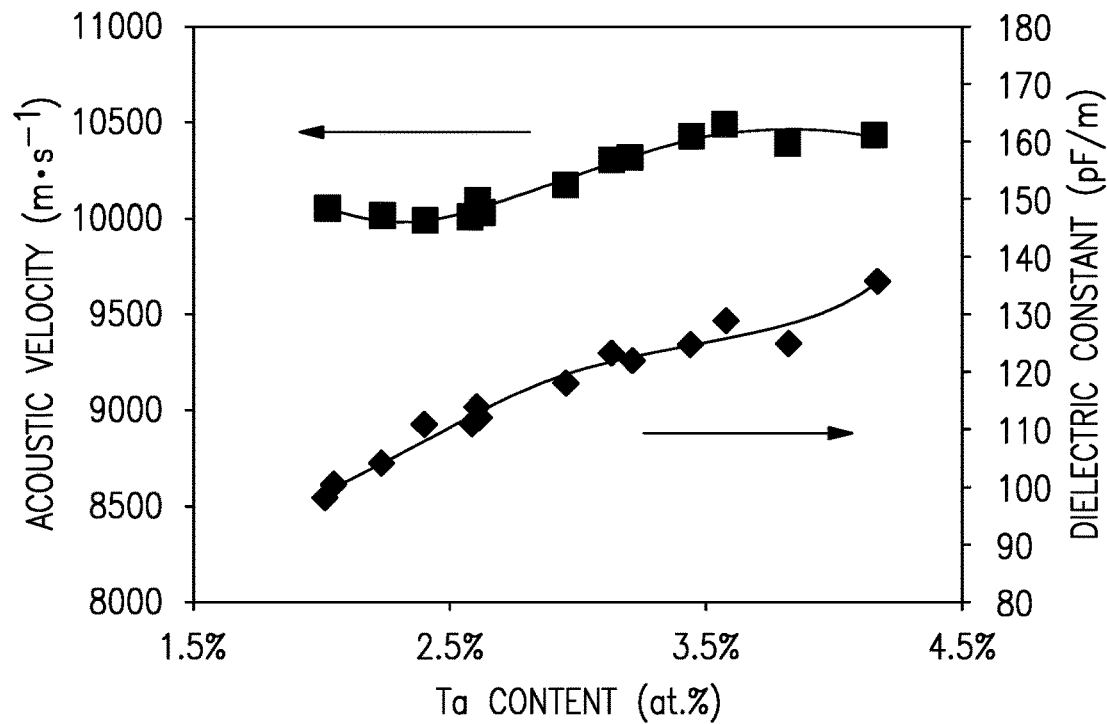
FIG. 14B is a chart of acoustic velocity and dielectric constant vs. Ta content in Ta-doped AlN.
Figure 14C:
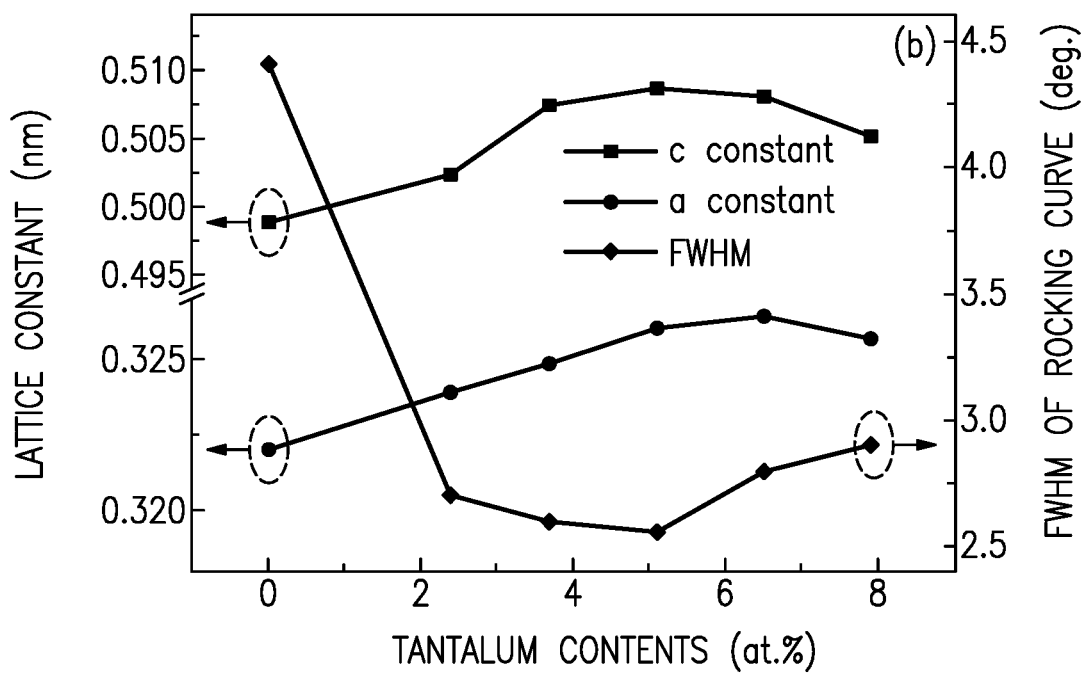
FIG. 14C is a chart of lattice constant vs. Ta content in Ta-doped AlN.
Figure 14D:
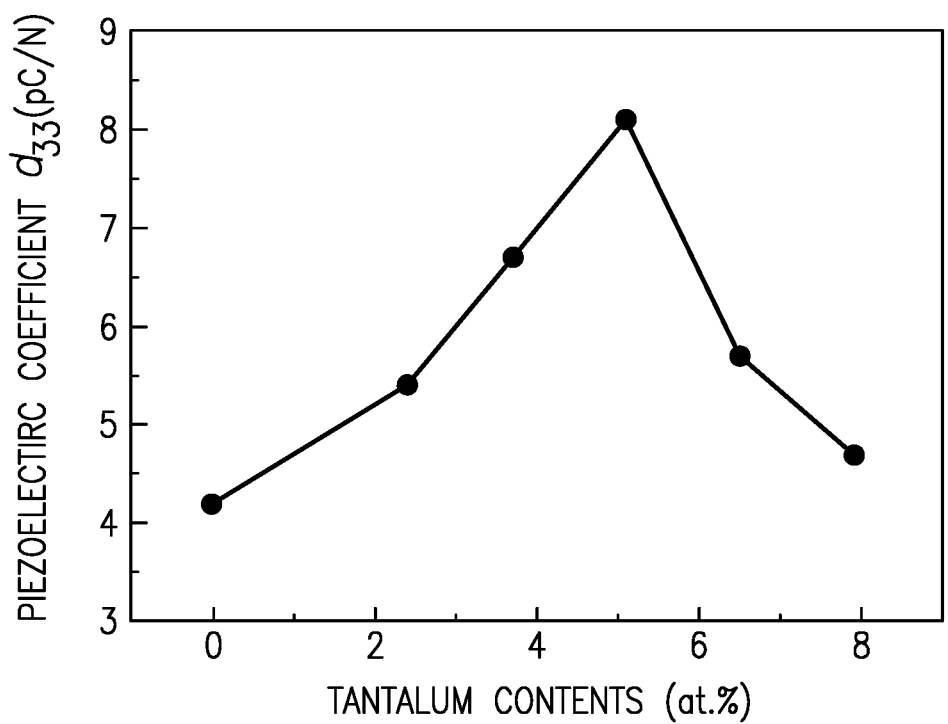
FIG. 14D is a chart of piezoelectric coefficient $d_{33}$ vs. Ta content in Ta-doped AlN.

Analysis of crystal chemical systematics from previous work has provided insights into how specific chemical substituents for aluminum (Al) in aluminum nitride (AlN) affect various properties of interest of the material. Disclosed herein are new chemical substituent combinations for AlN that may be used to form a piezoelectric material for use in acoustic wave filters such as Bulk Acoustic Wave (BAW) and Film Bulk Acoustic Resonator (FBAR) filters. Advantages of the solutions disclosed herein over previous solutions are that multiple material properties may be simultaneously optimized (for example, electromechanical coupling and sound velocity). Based on the knowledge of crystal chemistry and previous work, there appears to be a series of mutually exclusive property combinations resulting from doping for Al in AlN-based piezoelectric materials. For example, substitutions which form a more ionic bond with nitrogen than aluminum (such as scandium) will improve the coupling and dielectric constant whereas substitutions which form a more covalent bond with nitrogen than aluminum (such as boron) will improve the sound velocity and decrease viscoelastic losses. Disclosed herein are AlN-based piezoelectric materials which may exhibit improvements in multiple properties or which may exhibit extreme enhancements for specific individual properties (e.g. dielectric constant).

The most frequently cited additive to AlN is scandium (Sc). Scandium is more electropositive than Al. Increased ionicity of $Sc^{3+}$ relative to $Al^{3+}$ increases the piezoelectric coupling of Sc-doped AlN as compared to un-doped AlN. $Sc^{3+}$ is also larger than $Al^{3+}$. Distortion of the crystal lattice of AlN due to the presence of $Sc^{3+}$ substituted for $Al^{3+}$ increases the piezoelectric coefficient of Sc-doped AlN as compared to un-doped AlN. The loss of covalency due to the presence of $Sc^{3+}$ substituted for $Al^{3+}$ however, increases viscoelastic losses.

Y, Yb and other small lanthanides are larger ions than $Sc^{3+}$ and are more electropositive than Sc. Substitution of $Al^{3+}$ in AlN with ions of these elements may enhance both piezoelectric effect and viscoelastic losses. Heavier polarizable atoms such as $Yb^{3+}$ should improve the dielectric constant of the doped AlN more than lighter atoms such as $Sc^{3+}$ and $Y^{3+}$. Multiple isovalent substitutions (AlN:B, Sc or AlN:B, Yb) may also be used.

In contrast with Sc, Y, and Yb, boron (B) forms a much smaller ion than Al and is less electropositive than Al. Boron would form a more covalent bond with N than Al. Piezoelectric coupling may be expected to decrease slightly with B substitution for Al in AlN, but viscoelastic losses should decrease as well. The increased covalency of B—N bonds relative to Al—N bonds should increase the bulk modulus of B-doped AlN as compared to un-doped AlN. Light B atoms substituting for Al should also decrease the density of B-doped AlN as compared to un-doped AlN. Both effects should combine to give greater acoustic velocity (v= $(K/\rho)^{1/2}$, K=Bulk Modulus of Material; $\rho$=Density).

Figure 15:
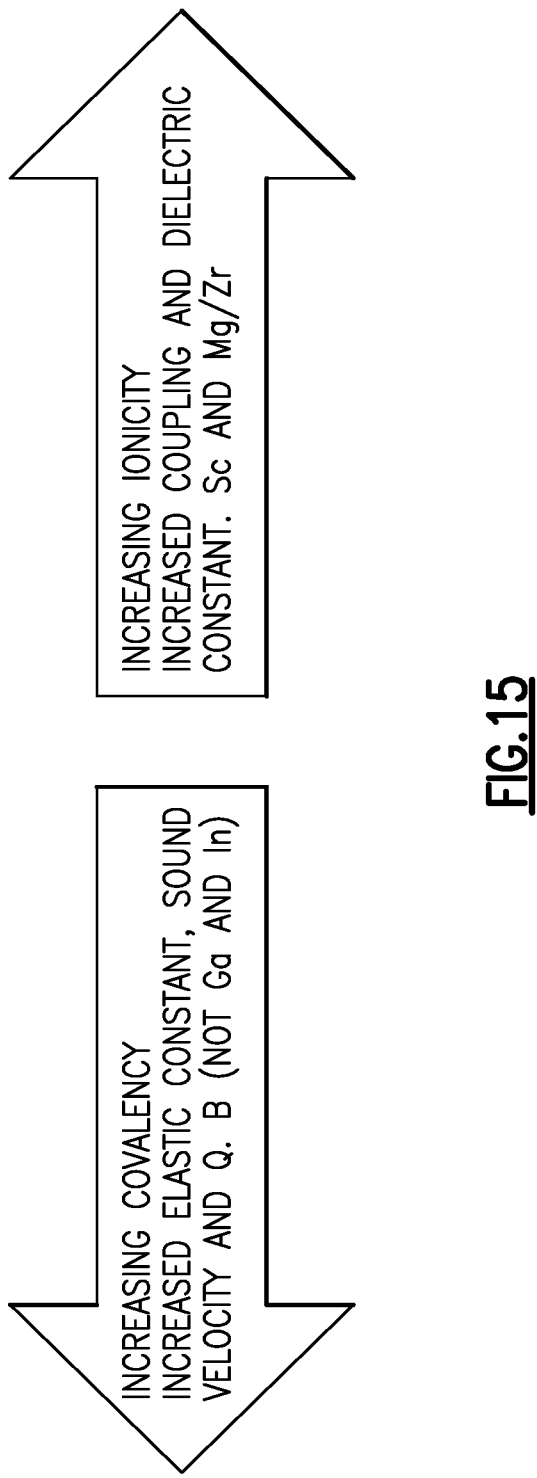
FIG. 15 illustrates conflicting tradeoffs in materials properties for different dopants in AlN.

Dopants for Al in AlN which enhance Q, elastic modulus, and sound velocity of the material appear to work against improved coupling coefficients and higher dielectric constants. This is represented schematically in FIG. 15. Simultaneous additions of different dopants and/or doping AlN to facilitate 3d electron interactions or to form ordered vacant lattice sites may provide the benefits associated with both highly electropositive and weakly electropositive dopants.

In transition metals, the d-electron manifold greatly complicates bonding. Ions may have preference for octahedral or tetrahedral coordination depending on d electron count. For example, $Cr^{3+}$ has extremely strong preference for octahedral coordination. If forced into a tetrahedral site, this may create strong lattice distortions enhancing piezoelectricity (even though the $Cr^{3+}$ ion is not as electropositive as Sc). Coupled substitution of B and Cr may produce lattice distortions enhancing piezoelectricity without viscoelastic losses. Other ions such as $V^{3+}$, $Mn^{3+}$, and $Co^{3+}$ can be useful as dopants to improve the properties of AlN. These ions can adjust to different oxidation states with $Co^{3+}$ having several spin states per oxidation state and can thus exhibit multiple different ionic radii.

In some embodiments, vacant lattice sites (0 electrons) may also be incorporated into the tetrahedral framework of Grimm-Summerfeld rules. An example is $\gamma$-$Ga_2S_3$ which is a $3_20_6_3$ type. Aluminum vacancies in AlN may be considered a quadruplet of non-bonding orbitals (lone pairs) in the tetrahedral structure. Aluminum vacancies in AlN may increase viscoelastic losses (especially if mobile) or enhance piezoelectric distortion without increasing ionicity.

Other compounds which may be useful in mixing with AlN to form a doped AlN material include the $4_30_5_4$ compounds such as $Si_3N_4$ and $Ge_3N_4$. $Ge_3N_4$ crystallizes in a defect-containing Wurtzite structure where cation vacancies are ordered. Increasing p orbital character in non-bonding orbitals leads to the tendency for $sp^2$ (planar) hybridization of bonding orbitals which may distort lattice the crystal lattice. Solid solutions such as $Al_{1-x}Ge_{3/4x}\square_{1/4x}N$ and $Al_{1-x}Si_{3/4x}\square_{1/4x}N$ are also of interest, where $\square$ represents a vacancy in an Al site of the crystal structure of the piezoelectric material.

In solid solutions of AlN with GaN and InN, $k^2$ and sound velocity are expected to drop. The dielectric constant of the material may therefore increase slightly relative to un-doped AlN along with the c/a ratio due to assumed linear relationships in properties.

The expected effect of various dopants on various material properties of AlN are tabulated in FIG. 16.

A listing of different AlN based piezoelectric materials that may exhibit desirable properties for use in acoustic wave resonators or filters and the expected effect of the dopant(s) on the base AlN material is presented in Table 2 below:

TABLE 2

| Compound Formula | Expected Effect of Dopant(s) |
|---|---|
| $Al_{1-x}(Sm^{3+}\ldots Yb^{3+})_xN$<br>$Sm^{3+}\ldots Yb^{3+}$ = any one or more of the Lanthanides with atomic numbers from 62-70. | $Yb^{3+}$ is larger more electropositive ion than $Sc^{3+}$ and smaller and more electropositive than $Y^{3+}$.<br>$Sm^{3+}$ is larger and more electropositive than both $Sc^{3+}$ and $Y^{3+}$ and has a high Shannon polarizability to improve dielectric constant.<br>As dopant level increases, expect to decrease Q and increase $k^2$ and dielectric constant. The sound velocity should decrease as well.<br>Higher ionicities than Sc—N bond. |

TABLE 2-continued

| Compound Formula | Expected Effect of Dopant(s) |
|---|---|
| $Al_{1-x-y}B_xM^{III}_yN$<br>$M^{III} = Sc^{3+}, Y^{3+}, Sm^{3+} \ldots Yb^{3+}$<br>This is a combination of boron and $Sc^{3+}$ or one or more electropositive ions such as $Y^{3+}$ or $Yb^{3+}$. The number of cation substitutions may be limited to three or less. | Expect higher dielectric constants than Sc doped AlN.<br>Boron and $M^{III}$ will work in opposite directions.<br>Three different sized ions on Al site may negatively impact Q. |
| $Al_{1-x-y}B_xCr^{3+}_yN$<br>This is a combination of boron and $Cr^{3+}$. | Potential for high sound velocity material with modest decreases in the coupling as compared to B substitution alone. Both B and Cr are reported to increase the sound velocity. They oppose each other with regard to $k^2$ and $\varepsilon'$. |
| $Al_{1-x-y}Cr^{3+}_xM^{III}_yN$<br>$M^{III} = Sc^{3+}, Y^{3+}, Sm^{3+} \ldots Yb^{3+}$<br>This is a combination of Cr and $Sc^{3+}$ or one or more electropositive ions such as $Y^{3+}$ or $Yb^{3+}$. | Potential for a high $k^2$ and $\varepsilon'$ material without significant reduction in sound velocity or viscoelastic losses. Improved Q a possibility. Cr induces lattice strain and deforms Wurzite structure. |
| $Al_{1-x}Co_xN$ | Co readily adapts 2+, 3+ and 4+ oxidation states and each oxidation state has multiple spin states leading to a set of potential ionic sizes. Single doping will likely lead to 3+ state but 4+ and 2+ states may be induced by co-doping with $Mg^{2+}$ or $Zr^{4+}$ (or $Hf^{4+}$) respectively.<br>Reduced electrical conductivity is a risk at high doping levels. |
| $Al_{1-x}Sb^{3+}_xN$ | $Sb^{3+}$ shows very high ionic polarizabilities leading to the potential for enhanced dielectric constant either for single doping or coupled doping with other ions. However, there is a risk that the Sb will adopt the $Sb^{-3}$ state and substitute for Nitrogen. The effect on $k^2$ is uncertain since the lone pair would enhance asymmetry in the Al site but the increased covalency would not. |
| $Al_{1-5/3x}Ta^{5+}_x\square_{2/3x}N$<br>$\square$ = Aluminum vacancy | Improvement in the piezoelectric coefficient expected for small additions of Ta. |
| $Al_{1-3x}Mg_{2x}Ta^5_xN$ | Improvement in the piezoelectric coefficient is observed for small additions.<br>Expect similar improvement in $k^2$ as the Mg/Zr or Mg/Hf co-doped materials with higher $\varepsilon'$ due to higher polarizability than Zr or Hf.<br>Acoustic velocity effect unknown. |
| $Al_{1-5/3x-3y}Mg^{2+}_{2y}Ta^{5+}_{x+y}\square_{2/3x}N$ | There can be a continuous series of Ta additives compensated by vacancies and $Mg^{2+}$.<br>Expect similar improvement in $k^2$ as the Mg/Zr or Mg/Hf co-doped materials with higher $\varepsilon'$ due to higher polarizability than Zr or Hf.<br>Acoustic velocity effect unknown. |
| $Al_{1-5/3x-3y}Li^+_yTa^{5+}_{x+y}\square_{2/3x}N$ | Expect similar improvement in k2 as the Mg/Zr or Mg/Hf co-doped materials with higher $\varepsilon'$ due to higher polarizability than Zr or Hf.<br>Acoustic velocity effect unknown. |
| $Al_{1-5/3x}Nb^{5+}_x\square_{2/3x}N$, $Al_{1-3x}Mg^{2+}_xNb^{5+}_xN$, $Al_{1-5/3x-3y}Li^+_yNb^{5+}_{x+y}\square_{2/3x}N$, or $Al_{1-5/3x-3y}Mg^{2+}_{2y}Nb^{5+}_{x+y}\square_{2/3x}N$<br>Combinations of Nb and Ta as well. | Same chemistries as with $Ta^{5+}$.<br>$Nb^{5+}$ more likely to be reduced than $Ta^{5+}$. |
| $Al_{1-x}Ge_{3/4x}\square_{1/4x}N$ or $Al_{1-x}Si_{3/4x}\square_{1/4x}N$<br>Si and Ge doping. | Possible increase in piezoelectric coefficient and coupling without significant decrease in sound velocity. However, it is likely Si and Ge partition onto both the AlN sites without the need charge compensating defects. Covalency would increase in both cases. |
| $Al_{1-2x}Mg^{2+}_xSi^{4+}_xN$ | Using $Mg^{2+}$ to bias Si into Al site for charge compensation. Possible double effect on $k^2$ and $d_{33}$. Large electropositive ions will boost $k^2$.<br>The $Si^{4+}$ may behave as a small charged ion (as in doped ZnO) and contribute to the $k^2$. More likely, it will enhance covalence and potentially give a solution with enhanced $k^2$ without the sound velocity degradation and viscoelastic losses. |
| $Al_{1-2x}Mg^{2+}_xTi^{4+}_xN$ | $Ti^{3+}$ may forms and $Mg_{Al}$ may be charge compensated with Magnesium vacancies. $d^0$ states in 1st row transition metals such as $Ti^{4+}$ and $V^{5+}$ unlikely to be stabilized in AlN. |

Figure 17:
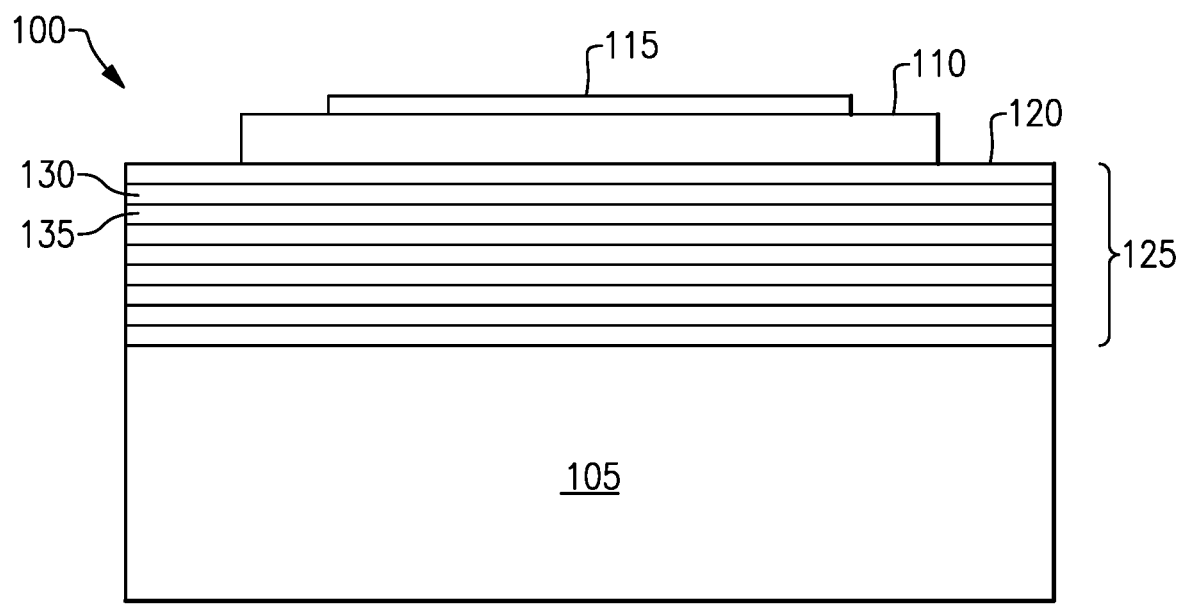
FIG. 17 is a cross-sectional view of an example of a solidly mounted resonator (SMR) BAW.

As discussed above, the various materials disclosed herein may be useful as piezoelectric materials in BAW resonators. In some implementations, the various materials disclosed herein may also be useful as piezoelectric materials in surface acoustic wave (SAW) resonators or filters. One type of BAW resonator is a solidly mounted resonator (SMR). One example of an SMR BAW is illustrated in FIG. 17, generally at 100. The SMR BAW is formed on a substrate 105, for example, a silicon substrate. A layer of piezoelectric material 110 is disposed on the substrate 105 between an upper electrode 115 and a lower electrode 120. The layer of piezoelectric material 110 may include or consist of any of the materials disclosed herein. The layer of piezoelectric material 110 has a thickness of λ/2, where X is the resonant frequency of the SMR BAW 100. A Bragg reflector or acoustic mirror 125 including alternating layers of high impedance material 130, for example, $SiO_2$, and low impedance material 135, for example, Mo or W, is disposed below the lower electrode 120 and helps confine acoustic energy to the piezoelectric material 110 rather than leaking away through the substrate 105. Each layer of material 120, 135 may have a thickness of λ/4.

Figure 18:
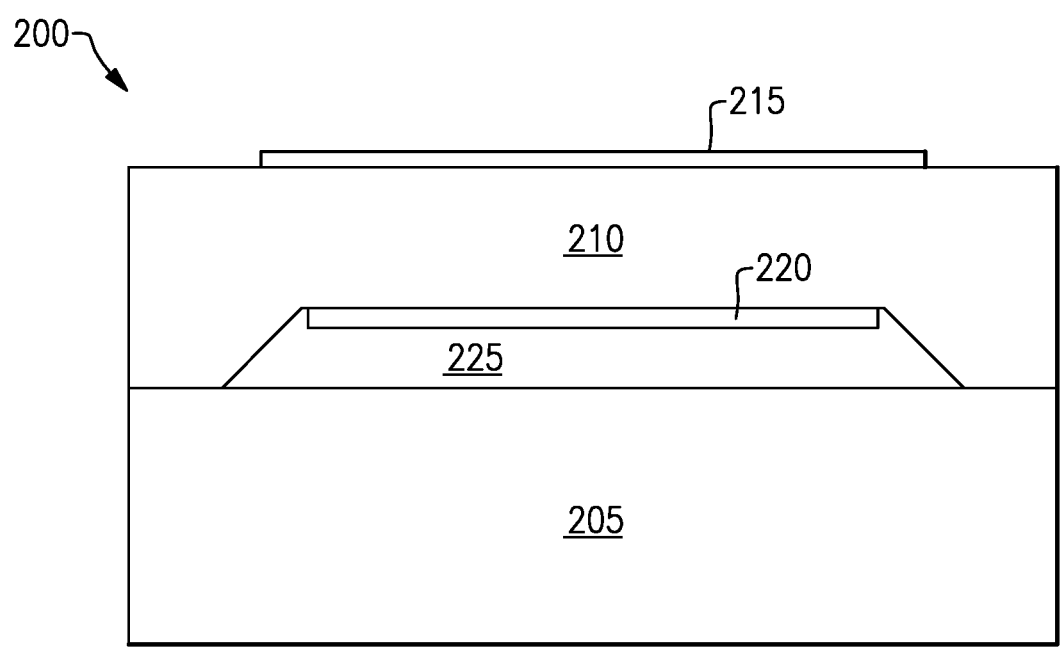
FIG. 18 is a cross-sectional view of an example of an FBAR BAW.

An example of an FBAR BAW is illustrated in FIG. 18, generally at 200. The FBAR BAW 200 includes a piezoelectric material film 210 disposed on a substrate 205, for example, a silicon substrate, between an upper electrode 215 and a lower electrode 220. A cavity 225 is formed below the piezoelectric material film 210 (and optionally below the lower electrode 220) and above the upper surface of the substrate 205 to allow for the piezoelectric material film 210 to vibrate. The piezoelectric material film 210 may include or consist of any of the materials disclosed herein.

Figure 19:
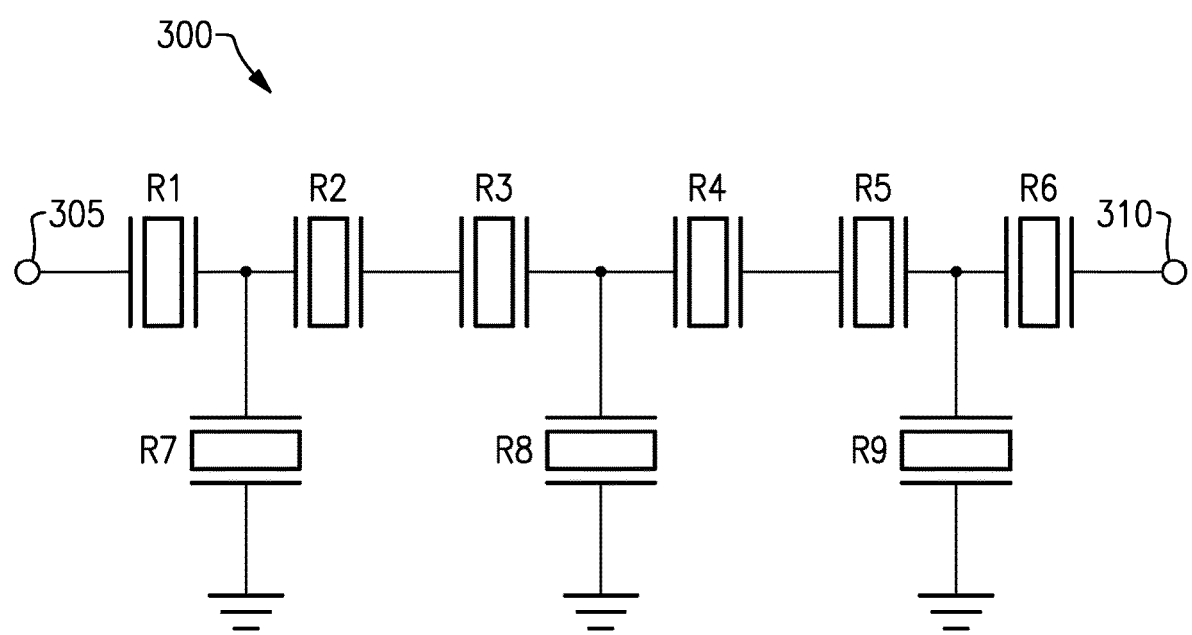
FIG. 19 is a schematic view of a filter than may include SMR BAW and/or FBAR BAW devices.

Examples of SMR BAW and/or FBAR BAW resonators including any of the materials disclosed herein as their piezoelectric elements may be combined together to form a filter. One example of a filter arrangement that may be useful in filtering signals in the radio frequency (RF) range may be a ladder filter 300 as illustrated schematically in FIG. 19. The ladder filter 300 includes a plurality of series resonators R1, R2, R3, R4, R5, R6 connected in series between an input port 305 and an output port 310 and a plurality of parallel resonators R7, R8, and R9 having first sides electrically connected between a pair of the series resonators and second sides electrically connected to a reference voltage, for example, ground. The resonant and anti-resonant frequencies of the resonators R1-R9 may be selected such that the ladder filter 300 passes RF energy within a desired passband from the input port 305 to the output port 310 while attenuating RF energy at frequencies outside of the passband. It should be appreciated that the number and arrangement of series and/or parallel resonators included in the ladder filter may vary based on the desired frequency response of the filter.

Figure 20:
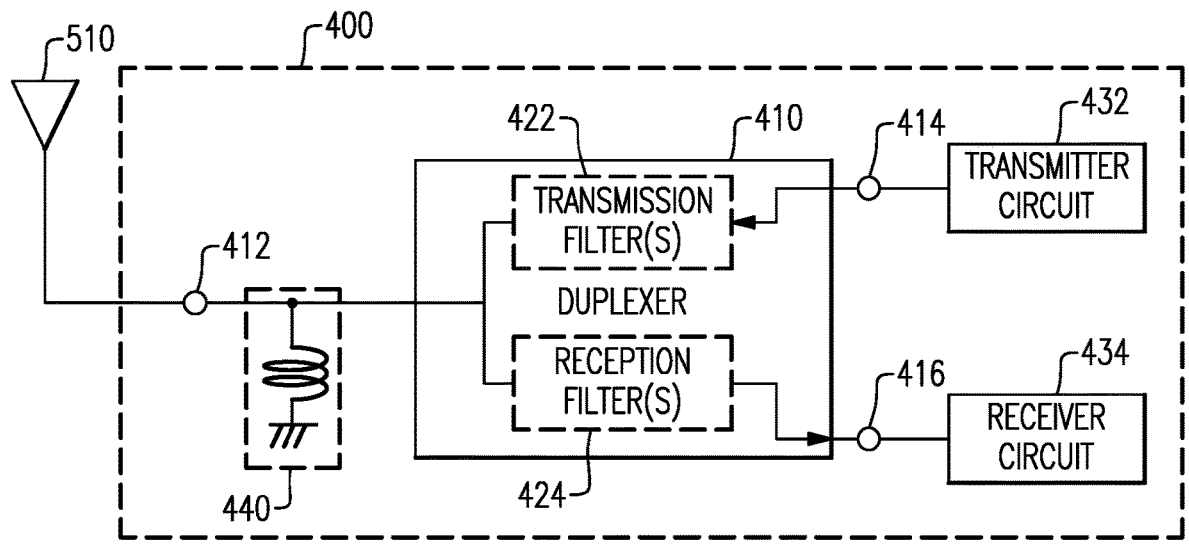
FIG. 20 is a block diagram of a front-end module in which the filter of FIG. 19 may be implemented.

Referring to FIG. 20, there is illustrated a block diagram of one example of a front-end module 400, which may be used in an electronic device such as a wireless communications device (e.g., a mobile phone) for example. The front-end module 400 includes an antenna duplexer 410 having a common node 412, an input node 414, and an output node 416. An antenna 510 is connected to the common node 412. The front-end module 400 further includes a transmitter circuit 432 connected to the input node 414 of the duplexer 410 and a receiver circuit 434 connected to the output node 416 of the duplexer 410. The transmitter circuit 432 can generate signals for transmission via the antenna 510, and the receiver circuit 434 can receive and process signals received via the antenna 510. In some embodiments, the receiver and transmitter circuits are implemented as separate components, as shown in FIG. 20; however in other embodiments these components may be integrated into a common transceiver circuit or module. As will be appreciated by those skilled in the art, the front-end module 400 may include other components that are not illustrated in FIG. 20 including, but not limited to, switches, electromagnetic couplers, amplifiers, processors, and the like.

The antenna duplexer 410 may include one or more transmission filters 422 connected between the input node 414 and the common node 412, and one or more reception filters 424 connected between the common node 412 and the output node 416. The passband(s) of the transmission filter(s) are different from the passband(s) of the reception filters. Each of the transmission filter(s) 422 and the reception filter(s) 424 may include one or more resonators including one or more embodiments of the piezoelectric material as disclosed herein. An inductor or other matching component 440 may be connected at the common node 412.

In certain examples, each of the acoustic wave elements used in the transmission filter 422 or the reception filter 424 include the same piezoelectric material. This structure reduces the effect of changes in temperature upon the frequency responses of the respective filter, in particular, reducing degradation in the passing or attenuation characteristics due to changes in the temperature, because each acoustic wave element changes similarly in response to changes in the ambient temperature.

Figure 21:
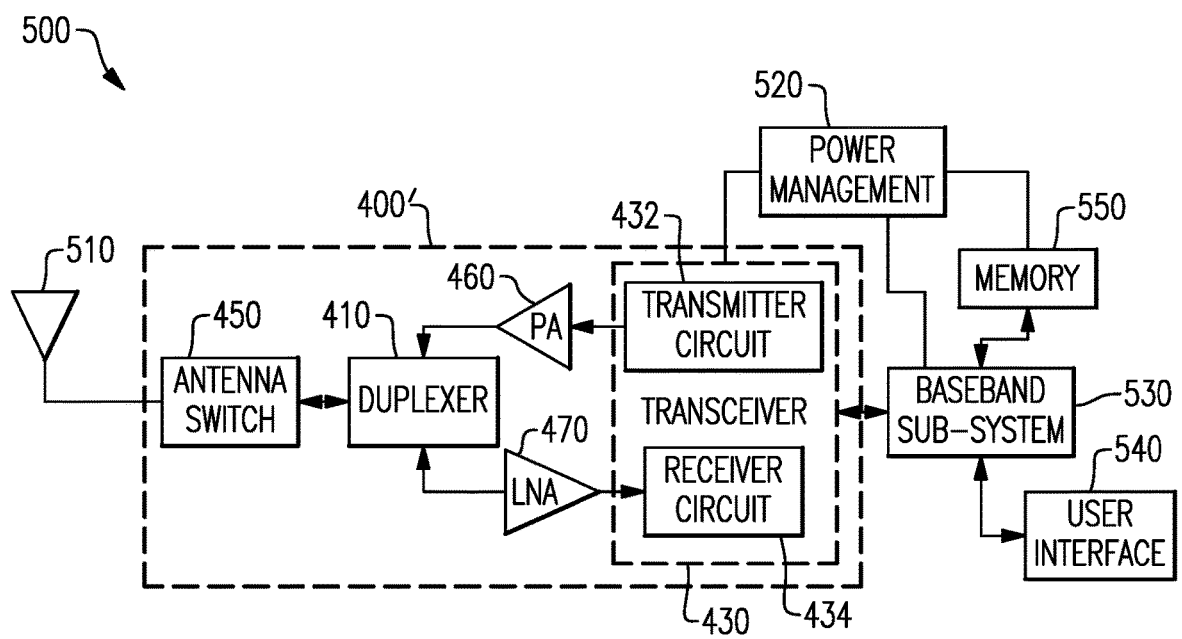
FIG. 21 is a block diagram of a wireless device in which the filter of FIG. 19 may be implemented.

FIG. 21 is a block diagram of one example of a wireless device 500 including the antenna duplexer 410 shown in FIG. 20. The wireless device 500 can be a cellular phone, smart phone, tablet, modem, communication network or any other portable or non-portable device configured for voice or data communication. The wireless device 500 can receive and transmit signals from the antenna 510. The wireless device includes an embodiment of a front-end module 400' similar to that discussed above with reference to FIG. 20. The front-end module 400' includes the duplexer 410, as discussed above. In the example shown in FIG. 21 the front-end module 400' further includes an antenna switch 450, which can be configured to switch between different frequency bands or modes, such as transmit and receive modes, for example. In the example illustrated in FIG. 21, the antenna switch 450 is positioned between the duplexer 410 and the antenna 510; however, in other examples the duplexer 410 can be positioned between the antenna switch 450 and the antenna 510. In other examples the antenna switch 450 and the duplexer 410 can be integrated into a single component.

The front end module 400' includes a transceiver 430 that is configured to generate signals for transmission or to process received signals. The transceiver 430 can include the transmitter circuit 432, which can be connected to the input node 414 of the duplexer 410, and the receiver circuit 434, which can be connected to the output node 416 of the duplexer 410, as shown in the example of FIG. 20.

Signals generated for transmission by the transmitter circuit 432 are received by a power amplifier (PA) module 460, which amplifies the generated signals from the transceiver 430. The power amplifier module 460 can include one or more power amplifiers. The power amplifier module 460 can be used to amplify a wide variety of RF or other frequency-band transmission signals. For example, the power amplifier module 460 can receive an enable signal that can be used to pulse the output of the power amplifier to aid in transmitting a wireless local area network (WLAN)

signal or any other suitable pulsed signal. The power amplifier module 460 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the power amplifier module 460 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 21, the front-end module 400' may further include a low noise amplifier module 470, which amplifies received signals from the antenna 510 and provides the amplified signals to the receiver circuit 434 of the transceiver 430.

The wireless device 500 of FIG. 21 further includes a power management sub-system 520 that is connected to the transceiver 430 and manages the power for the operation of the wireless device 500. The power management system 520 can also control the operation of a baseband sub-system 530 and various other components of the wireless device 500. The power management system 520 can include, or can be connected to, a battery (not shown) that supplies power for the various components of the wireless device 500. The power management system 520 can further include one or more processors or controllers that can control the transmission of signals, for example. In one embodiment, the baseband sub-system 530 is connected to a user interface 540 to facilitate various input and output of voice and/or data provided to and received from the user. The baseband sub-system 530 can also be connected to memory 550 that is configured to store data and/or instructions to facilitate the operation of the wireless device, and/or to provide storage of information for the user.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. It is to be appreciated that embodiments of the methods and apparatuses discussed herein are not limited in application to the details of construction and the arrangement of components set forth in the foregoing description or illustrated in the accompanying drawings. The methods and apparatuses are capable of implementation in other embodiments and of being practiced or of being carried out in various ways. Examples of specific implementations are provided herein for illustrative purposes only and are not intended to be limiting. One or more features of any embodiment disclosed herein may be added to or substituted for any one or more features of any other embodiment. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation. Accordingly, the foregoing description and drawings are by way of example only.

What is claimed is:

1. An acoustic wave resonator comprising a piezoelectric material formed of aluminum nitride doped with calcium to enhance performance of the acoustic wave resonator, wherein the calcium is charge balanced with at least one of silicon and germanium and the piezoelectric material has a chemical formula of one of $Al_{1-2x}Ca_xSi_xN$ (0<$x$<1); or $Al_{1-2x}Ca_xGe_xN$ (0<$x$<1).

2. An acoustic wave filter including the acoustic wave resonator of claim 1.

3. The acoustic wave filter of claim 2 wherein the acoustic wave resonator is a bulk acoustic wave resonator.

4. The acoustic wave filter of claim 3 wherein the bulk acoustic wave resonator is one of a film bulk acoustic wave resonator, a Lamb wave resonator, or a surface mounted resonator.

5. The acoustic wave filter of claim 3 wherein the acoustic wave filter is a radio frequency filter.

6. An electronics module including the acoustic wave filter of claim 5.

7. An electronic device including the electronics module of claim 6.

8. The acoustic wave resonator of claim 1 wherein the piezoelectric material has a Wurtzite crystal structure.

9. A method of forming an acoustic wave resonator comprising: forming a piezoelectric film formed of aluminum nitride doped with calcium, wherein the calcium is charge balanced with at least one of silicon and germanium and the piezoelectric material has a chemical formula of one of $Al_{1-2x}Ca_xSi_xN$ (0<$x$<1); or $Al_{1-2x}Ca_xGe_xN$ (0<$x$<1); and depositing electrodes on the piezoelectric film to form the acoustic wave resonator.

10. The method of claim 9 wherein depositing the electrodes on the piezoelectric film in includes depositing a first electrode on a top surface of the piezoelectric film and depositing a second electrode on a bottom surface of the piezoelectric film.

11. The method of claim 10 wherein the acoustic wave resonator is a film bulk acoustic wave resonator and the method further comprises defining a cavity below the bottom surface of the piezoelectric film.

12. The method of claim 10 wherein the acoustic wave resonator is a Lamb wave resonator and depositing the first electrode on the top surface of the piezoelectric film comprises depositing interdigital transducer electrodes on the top surface of the piezoelectric film.

13. The method of claim 10 wherein the acoustic wave resonator is a solidly mounted resonator and the method further comprises forming the piezoelectric film on a top surface of a Bragg reflector.

14. An acoustic wave resonator including a film of piezoelectric material and an electrode disposed on the film of piezoelectric material, the film of piezoelectric material comprising:

AlN doped with cations of one or more elements selected from the group consisting of:
- a) one of Sb, or Nb;
- b) Cr in combination with one or more of B, Sc, Y, Sm, Eu, Gd, Tb, Dy, Ho, Er, Tm, or Yb;
- c) one of Nb and Ta in combination with one of Li, Ca, Ni, or Co;
- d) Ca in combination with one of Si or Ge;
- e) Mg in combination with one of Si or Ge; or
- f) one or more of Co, Sb, Ta, Nb, Si, or Ge in combination with one or more of Sm, Eu, Gd, Tb, Dy, Ho, Er, Tm, or Yb;

the cations at least partially substituting for Al in a crystal structure of the piezoelectric material.

15. The acoustic wave resonator of claim 14 wherein the piezoelectric material has a Wurtzite crystal structure.

16. The acoustic wave resonator of claim 14 configured as a solidly mounted resonator.

17. The acoustic wave resonator of claim 14 configured as a film bulk acoustic resonator.

18. A filter including the acoustic wave resonator of claim 14.

19. The filter of claim 18 having a passband in the radio frequency band.

20. An electronic device module including the filter of claim 18.

21. An electronic device including the electronic device module of claim 20.

22. The electronic device of claim 21 wherein the electronic device module is a radio frequency electronic device module.

* * * * *